US012040659B2

United States Patent
Wu et al.

(10) Patent No.: US 12,040,659 B2
(45) Date of Patent: Jul. 16, 2024

(54) METHOD FOR EVALUATING ELECTROMAGNETIC PERFORMANCE OF ELECTRIC MACHINES IN PARTICULAR OF PERMANENT-MAGNET MACHINES

(71) Applicant: Zhejiang University, Zhejiang (CN)

(72) Inventors: Lijian Wu, Zhejiang (CN); Youtong Fang, Zhejiang (CN); Hao Yin, Zhejiang (CN); Ying Meng, Zhejiang (CN); Minchen Zhu, Zhejiang (CN)

(73) Assignee: Zhejiang University, Hangzhou (CN)

( * ) Notice: Subject to any disclaimer, the term of this patent is extended or adjusted under 35 U.S.C. 154(b) by 424 days.

(21) Appl. No.: 17/334,850

(22) Filed: May 31, 2021

(65) Prior Publication Data

US 2021/0313848 A1  Oct. 7, 2021

Related U.S. Application Data

(63) Continuation of application No. PCT/CN2019/120402, filed on Nov. 22, 2019.

(30) Foreign Application Priority Data

Nov. 30, 2018 (CN) .......................... 201811453722.7

(51) Int. Cl.
   *G01R 31/34* (2020.01)
   *H02K 1/16* (2006.01)
   *H02K 1/27* (2022.01)
   *H02K 1/278* (2022.01)

(52) U.S. Cl.
   CPC ............. *H02K 1/16* (2013.01); *G01R 31/343* (2013.01); *H02K 1/27* (2013.01); *H02K 1/278* (2013.01)

(58) Field of Classification Search
   CPC ............ H02K 1/16; H02K 1/27; H02K 1/278; H02K 15/03; G01R 31/343; G01R 29/0864; G06F 30/20; G06F 30/17
   See application file for complete search history.

(56) References Cited

FOREIGN PATENT DOCUMENTS

| CN | 103823926 A | 5/2014 |
|----|-------------|--------|
| CN | 103984864 A | 8/2014 |
| CN | 104063556 A | 9/2014 |
| CN | 104091060 A | 10/2014 |

(Continued)

OTHER PUBLICATIONS

Hanic et al., "A Novel Method for No-Load Magnetic Field Analysis of Saturated Surface Permanent-Magnet Machines Using Conformal Mapping and Magnetic Equivalent Circuits", 2016 (Year: 2016).*

(Continued)

*Primary Examiner* — Feba Pothen

(57) ABSTRACT

Method for evaluating electromagnetic performance of a permanent-magnet machine, wherein the method is implemented in a computer processer or in a controller of a permanent-magnet machine, calculating the magnetic field distribution by a sub-domain method; using current density of the equivalent current sheet to represent the boundary condition, iterating by the sub-do-main method and by the magnetic circuit method until a convergent result is obtained, calculating the electro-magnetic performance parameters on basis of the convergent result, so as to evaluate the electromagnetic performance.

14 Claims, 22 Drawing Sheets

(56) References Cited

FOREIGN PATENT DOCUMENTS

| CN | 105005692 | A |   | 10/2015 |            |
|----|-----------|---|---|---------|------------|
| CN | 108563912 | A | * | 9/2018  | G06F 30/23 |
| CN | 108595772 | A |   | 9/2018  |            |

OTHER PUBLICATIONS

International Search Report of PCT Patent Application No. PCT/CN2019/120402 issued on Feb. 24, 2020.

Wu, Lijian et al., On-Load Field Prediction in SPM Machines by a Subdomain and Magnetic Circuit Hybrid Model, IEEE Transactions on Industrial Electronics, Sep. 25, 2019, ISSN: 1557-9948, sections I-IV.

Yin, Hao et al., Magnetic Field Prediction in Surface-mounted PM Machines with Parallel Slot based on a Nonlinear Subdomain and Magnetic Circuit Hybrid Model, 2019 IEEE International Electric Machines & Drives Conference, May 15, 2019, pp. 1427-1432, sections I-IV.

* cited by examiner

METHOD FOR EVALUATING ELECTROMAGNETIC PERFORMANCE OF ELECTRIC MACHINES IN PARTICULAR OF PERMANENT-MAGNET MACHINES

CROSS REFERENCE TO RELATED APPLICATIONS

The present application is a Continuation Application of PCT Application No. PCT/CN2019/120402 filed on Nov. 22, 2019, which claims the benefit of Chinese Patent Application No. 201811453722.7 filed on Nov. 30, 2018. All the above are hereby incorporated by reference in their entirety.

FIELD OF THE INVENTION

The present invention relates to the field of permanent magnet machine, and more particularly to methods for evaluating electromagnetic performance of electric machines in particular of permanent-magnet machine.

BACKGROUND

Permanent magnet machines have received wide attention due to their high torque density, high power density and efficiency. In order to design permanent magnet machines that meet the use requirements and optimize them and shorten the design cycle, it is extremely important to select a suitable model for electromagnetic analysis at different machine design stages. For example, in the initial stage of machine design, designers often hope that the machine models can quickly solve problems and find the design direction; and in the later stage of machine design, designers hope that the machine models are as accurate as possible and close to the results of real object, to reduce errors.

Existing models are divided into numerical models, analytical models, magnetic circuit models, and composite models. The numerical models can be used to solve the machine with complicated structure and accurately calculate the core saturation effect, but usually the solving time is too long, resulting in a long design cycle; moreover, the performance cannot directly correspond to the machine dimension parameters, therefore, it is difficult for performance optimization. The analytical method is fast for solving, and the machine performance is directly related to the dimension parameters, therefore, it can provide optimization. Usually the analytic method methods are divided into relative permeability method, complex permeability method, and sub-domain method. However, the analytical method can be used to solve the linear models only, that is, it is assumed that the machine stator and rotor yoke has infinite permeability, so the error will increase as the machine saturation increases. For magnetic circuit method, the nonlinearity of the core can be calculated by the Kirchoff s law and Newton-Raphson method; however, there are a large number of simplified processes in the magnetic circuit equivalent, which essentially discretizes a continuous field distribution, therefore, the magnetic field distribution cannot be accurately predicted.

CN 105005692 A discloses a method of a permanent magnet motor field analysis and torque calculation. According to the structural features of a permanent magnet motor model, the analytical model is divided into a permanent magnet sub-domain, a gap sub-domain and a slot sub-domain; a magnetic vector Laplace equation or a Poisson equation is established in each sub-domain; sub-domain equations are connected through boundary conditions.

CN 104091060A discloses a method of calculating a permanent magnet motor magnetic field. Laplace equation or Poisson equation is built for different areas.

CN 104063556A discloses a method of building an equipment magnetic model for a permanent magnetic motor.

CN 103984864A discloses a method of calculating a permanent magnet motor magnetic field. The method comprises a step that a research region is divided into a permanent magnet region, an air gap region and a stator slot region.

CN 103823926A discloses a method of optimizing the design of magnetic conductivity of a permanent-magnet-motor sheath, wherein air gap magnetic fields and induced electromotive forces are calculated for motors of different sizes and of the same structure.

CN 108595772A discloses a method of building a model for a permanent magnet motor, wherein an iterative algorithm is used to solve the matrix quickly.

SUMMARY

The present invention can accurately predict the tangential and radial magnetic field distribution in the permanent magnet body, the air gap and the stator slot by considering the nonlinearity of the machine core, and accurately calculate electromagnetic performance parameters such as the flux linkage of the machine, counter electromotive force, cogging torque, terminal voltage, total torque, imbalance force on the basis of the magnetic field distribution.

The present invention provides a method for evaluating electromagnetic performance of a permanent-magnet machine as described in claim 1 as well as some advantageous embodiments as described in the dependent claims.

A method for evaluating electromagnetic performance of a PM machine, comprising: establishing an electromagnetic analytical model of the machine, the solution domain of the analytical model being at least divided into a permanent magnet sub-domain, an air gap sub-domain, and a stator slot sub-domain, and calculating the current magnetic field distributions of the air gap sub-domain, stator slot sub-domain and/or permanent magnet sub-domain based on a sub-domain method by the analytical model through a Poisson equation or a Laplace equation; adding an equivalent current sheet to the boundary of the target sub-domain and interface between the target sub-domain and a adjacent sub-domain respectively, representing the boundary condition and interface condition by the current density of the equivalent current sheet, and solving the magnetic field distribution by a sub-domain method; solving the magnetic potential difference of each part of the core by a magnetic circuit method according to the current magnetic field distribution, and converting the magnetic potential difference to a current density of the equivalent current sheet; iterating the magnetic field distribution obtained by the sub-domain method and the current density obtained by the magnetic circuit method until a convergent current density is obtained, solving the magnetic field distribution of the target sub-domain with the convergent current density; obtaining the electromagnetic performance evaluation results based on the electromagnetic performance parameter values obtained based on magnetic field distribution, the standard values of the electromagnetic performance parameters pre-stored in the processor or controller, and a comparison step of the calculated values and standard values of the electromagnetic performance parameters executed by the processor or controller.

Each type of motor has its standard values of electromagnetic performance parameters. When the difference between the calculated value and the standard value of electromagnetic performance parameter is within the allowable error range, the electromagnetic performance of the motor is considered to meet the standard. If the difference exceeds the allowable error range, the electromagnetic performance of the motor is considered not to meet the standard. During the electromagnetic design phase of the motor, the method is executed on the computer processor. If the electromagnetic performance does not meet the standard, the design size of the motor needs to be modified until the electromagnetic performance of the motor meets the standard at the size. The method can be executed on a remote computer processor or a controller of the motor if the motor is in the running stage; and if the electromagnetic performance of the motor does not meet the standards, an early warning will be given.

When it is required to calculate the magnetic field distribution of the status slot sub-domain, the stator slot sub-domain is the target sub-domain. After solving the magnetic field distribution of each sub-domain, electromagnetic performance parameters such as flux linkage, counter electromotive force, cogging torque, terminal voltage, load torque, unbalance force of the permanent magnet machine can be calculated according to the existing methods.

The conventional sub-domain method assumes that both the stator and the rotor silicon steels have infinite permeability, so the saturation effect of the machine cannot be considered. In the present invention, considering that the saturation effect is essentially the existence of a magnetic potential difference in the stator, and by using Ampere's law, the magnetic potential difference can be equivalent to the current density of the equivalent current sheets on the slot side and slot bottom; and after equivalence, the stator silicon steel permeability can be reconsidered as infinity. This current value can be solved by the magnetic circuit method and as the boundary condition of the slot region in the sub-domain method. The magnetic flux into the stator is calculated by the sub-domain method, as a magnetic flux source in the magnetic circuit method. The magnetic circuit method provides a current density of equivalent current sheet for the sub-domain method, with iteration relationship between them, when the current density of the current sheet converges, it is considered as the final saturation, at this time, the result calculated by the sub-domain method is the magnetic field distribution of the permanent magnet machine in consideration of the saturation, and the electromagnetic performance of the machine can be obtained based on the magnetic field distribution.

Preferably, when a vector magnetic potential expression of the stator slot sub-domain is established by the sub-domain method and the stator slot is an open slot, the boundary condition includes a boundary condition of the two slot sides and a boundary condition of the slot bottom, when calculating the vector magnetic potential expression of the permanent magnet sub-domain and the air gap sub-domain, the boundary condition is not changed; when the stator slot has a slot opening, the boundary condition includes the boundary condition of the two slot sides, the boundary condition of the slot bottom, and the boundary condition of the slot opening edge.

According to the boundary condition and interface condition in each sub-domain, the undetermined coefficients in each sub-domain expression is solved by simultaneous equations, when compiling a program, the equations set is written as a matrix, and there is matrix inversion process when the undetermined coefficients are solving, and after the undetermined coefficients are solved, the magnetic field distribution in each sub-domain is obtained.

For different stator slot types, the boundary conditions of stator slot sub-domains are different. The stator slots include open slots and semi-closed slots.

For open slots, the stator slot sub-domain includes the boundary condition of slot side and the boundary condition of slot bottom, and the boundary condition is represented by: $H_{3ri}|\alpha=\alpha_i+b_{sa}/2=J_{i1}$; $H_{3ri}|\alpha=\alpha_i-b_{sa}/2=-J_{i2}$; $H_{3\alpha i}|r=R_{sb}=-J_{i3}$; where, $b_{oa}$ is the slot width, $J_{i1}$ is the current density of the equivalent current sheet on the first slot side of the stator slot, $J_{i2}$ is the current density of the equivalent current sheet on the second slot side of the stator slot, $J_{i3}$ is the current density of the equivalent current sheet at the slot bottom of the stator slot.

For semi-closed slots, the stator slot sub-domain includes the boundary condition of two slot sides and the boundary condition of the slot bottom, and the condition of two sides of the slot opening, and the boundary condition is represented by: $H_{3ri}|\alpha=\alpha_i+b_{sa}/2=J_{i1}$; $H_{3ri}|\alpha=\alpha_i-b_{sa}/2=-J_{i2}$; $H_{3\alpha i}|r=R_{sb}=-J_{i3}$; $H_{4ri}|\alpha=\alpha_i+b_{oa}/2=J_{i4}$; $H_{4ri}|\alpha=\alpha_i-b_{oa}/2=-J_{i5}$; where, $b_{oa}$ is the width of slot opening, $J_{i1}$ is the current density of the equivalent current sheet on the first slot side of the stator slot, $J_{i2}$ is the current density of the equivalent current sheet on the second slot side of the stator slot, $J_{i3}$ is the current density of the equivalent current sheet at the slot bottom of the stator slot; $J_{i4}$ is the current density of the equivalent current sheet on the first slot side of the stator slot opening, $J_{i5}$ is the current density of the equivalent current sheet on the second slot side of the stator slot opening.

Considering the rotor saturation, in addition to the boundary condition of the stator slot sub-domain, the boundary condition at the interface between the rotor yoke and the permanent magnet should also be considered.

When the rotor is a consequent-pole rotor, the range of the consequent-pole machine permanent magnet sub-domain is: $\alpha_{im}-\alpha_{mag}/2 \leq \alpha \leq \alpha_{im}+\alpha_{mag}/2$; where, $\alpha_{mag}$ is the width angle of the permanent magnet, $\alpha_{im}$ is the center line of the i-th permanent magnet, the consequent-pole rotor permanent magnet sub-domain is added with the boundary condition on the interface with the adjacent soft magnetic material, and the boundary condition is represented by the magnetic flux density: $B_{rmi}|\alpha=\alpha_{im}\pm\alpha_{mag}=0$, $B_{rmi}$ represents the radial magnetic flux density in the permanent magnet.

The consequent-pole rotor means that the rotor comprises a permanent magnet and a soft magnetic material, and the permanent magnet and the soft magnetic material are spaced apart, that is, a soft magnetic material is added between two adjacent permanent magnets.

When the rotor is a non-consequent-pole rotor, the permanent magnet sub-domain of the rotor is within the range of $0-2\pi$, and the permanent magnet sub-domain of the rotor is added with a boundary condition at the interface between the permanent magnet and the rotor yoke, the boundary condition is represented by the current density of an equivalent current sheet.

Preferably, the analytical model divides the solution domain on the 2D plane when the two-dimensional magnetic circuit is used as the target magnetic field of the analytical model.

Preferably, when solving with the magnetic circuit method, the silicon steel of stator core tooth portion and yoke portion is equivalent to different magnetic reluctance to construct a magnetic network, and the obtained current magnetic field distribution is converted into the magnetic flux into the stator as a magnetic flux source in the magnetic circuit method, to obtain the magnetic potential difference of each stator tooth and stator yoke by solving, the magnetic potential difference of the stator tooth and stator yoke is equivalent to the current density of equivalent current sheets on the slot side and slot bottom. The current magnetic field distribution comprises the magnetic field distribution of the sub-domain with which all the stator cores are in direct contact, including the air gap sub-domain in addition to the stator slot sub-domain; that is, the magnetic field distribution in the air gap and slot obtained by the current sub-domain method is converted to a magnetic flux into the stator.

When solving the magnetic potential difference of each stator tooth and stator yoke, a node magnetic potential difference matrix equation is constructed according to kirchhoff's law, and then a convergent solution of the node magnetic potential difference matrix is obtained using Newton-Raphson's law, where, the node magnetic potential difference matrix equation is:

$V=(A\Lambda A^T)^{-1}\Phi$; where, A is the associated matrix, $\Lambda$ is the branch magnetic reluctance matrix, V is the node magnetic potential difference matrix, $\Phi$ is the node magnetic flux matrix, and the magnetic flux into the stator is obtained by integrating the magnetic flux density and the area in the stator slot and the air gap.

In the magnetic circuit method, there is a convergent solution for solving the node magnetic potential difference matrix by using the current magnetic field distribution cycle, indicating the magnetic field distribution of the stator core under the magnetic field distribution of the current sub-domain method and the convergent solution of the node magnetic potential difference matrix are equivalent to a current density.

The convergence means that the difference of current density is less than an allowable error range.

When considering the saturation of the rotor yoke, a magnetic network is established at the rotor yoke to calculate the current density of the equivalent current sheet between the rotor yoke and the rotor permanent magnet, and the current density is taken as the boundary condition at the interface between the rotor yoke and the rotor permanent magnet.

Preferably, when iteration of the magnetic field distribution obtained by sub-domain method and the current density obtained by magnetic circuit method is performed, the current density of the equivalent current sheet is preset to 0, and the sub-domain method is used to solve the magnetic field distribution for the first time, to obtain the magnetic flux into the stator; then the magnetic potential difference of each tooth portion and yoke portion of the stator is solved by the magnetic circuit method, and the current density value of corresponding equivalent current sheet is obtained by the magnetic potential difference; then current density value is used as a boundary condition of the sub-domain method to resolve; the above iterative process is repeated until the difference between the current density obtained in the previous iteration and the current density obtained in this iteration is within the preset threshold range.

The mutual iteration between the magnetic circuit method and the sub-domain method is: the current density obtained by the convergent solution of the node magnetic potential difference matrix is taken into the sub-domain method as a boundary condition and/or an interface condition, to obtain the current magnetic field distribution by the sub-domain method, then calculate the status core magnetic field distribution to judge if the current density of this time and the current density of the previous time are converged; and if not, the current magnetic field distribution is taken into the magnetic circuit method, to solve the convergent solution of the node magnetic potential difference matrix again, and repeat the iterations until the current density of this time and the current density of the previous time are converged.

A method for evaluating electromagnetic performance of a PM machine based on three-dimensional magnetic circuit, comprising:

establishing an analytical model by a three-dimensional magnetic circuit, wherein the three-dimensional magnetic circuit includes a plurality of sub-sheets divided by the non-ferromagnetic material in the axial direction, and the solution domain of each sub-sheet being at least divided into a permanent magnet sub-domain, an air gap sub-domain, and a stator slot sub-domain, and calculating the current magnetic field distributions of the air gap sub-domain, stator slot sub-domain and/or permanent magnet sub-domain based on a sub-domain method by the analytical model through a Poisson equation or a Laplace equation; adding an equivalent current sheet to the boundary of the target sub-domain and interface between the target sub-domain and an adjacent sub-domain respectively, representing the boundary condition and interface condition by the current density of the equivalent current sheet, and solving the magnetic field distribution by a sub-domain method; the magnetic field node of all the sub-sheet being arranged in the same position, the magnetic field node at the same position of the adjacent sub-sheet being connected, the magnetic path connecting direction of the adjacent sub-sheets being axially connected, the magnetic reluctance distribution of all the sub-sheets and the connecting magnetic reluctance between adjacent sub-sheets forming a three-dimensional magnetic circuit of the machine, and solving the magnetic potential difference convergent solution of the three-dimensional magnetic circuit method according to the magnetic circuit method, and converting magnetic potential difference convergent solution to a current density of the equivalent current sheet; iterating the magnetic field distribution obtained by the sub-domain method and the current density obtained by the magnetic circuit method until a convergent current density is obtained, solving the magnetic field distribution of the target sub-domain with the convergent current density; calculating the electromagnetic performance parameters based on the magnetic field distribution and evaluating the electromagnetic performance of the machine based on the electromagnetic performance parameters.

The solving of the sub-domain method is the same as the above two-dimensional magnetic field analytical model. A three-dimensional magnetic field is constructed by the magnetic circuit method. The solving of three-dimensional magnetic field includes the magnetic reluctance in each sub-sheet and the connected magnetic reluctance between adjacent sub-sheets, and the other solving is the same as that of the two-dimensional magnetic field analytical model. Because of different temperature distribution at the axial direction, the degree of nonlinearity is different, and the magnetic field distribution of each sub-sheet is different; therefore, the uneven distribution of the magnetic field in the axial direction can be calculated by the sub-sheets elaborately, and for complex and diverse machine structures, the oblique pole and stator core discontinuity can be calculated.

The axial sub-sheets of the three-dimensional magnetic field are different in the nonlinear state of the stator core caused by the difference in temperature in the axial direction, that is, the BH curve of the stator core is different, so the part with similar nonlinearity (that is, the part that the same BH curve can be used) is used as a sub-sheet; or because of axially different structures, such as rotor block, oblique pole, stator slot discontinuity, etc., the part with the same axial section is used as a sub-sheet.

Regardless of the sub-sheet method, the position of the magnetic field node in all sub-sheets is the same, each sub-sheet uses the respective BH curve to solve the magnetic reluctance of the current sheet; in the three-dimensional magnetic circuit, the stator core of each sub-sheet is equivalent to a two-dimensional magnetic circuit. The BH curve of the current sub-sheet is used to solve the magnetic reluctance in the sub-sheet. The same node position of the adjacent sub-sheets is connected by the connected magnetic reluctance, and the connected magnetic reluctance meter and the magnetic flux. The solution parameters of the entire three-dimensional magnetic circuit include the magnetic potential difference between the nodes in each sub-sheet and the magnetic potential difference between the same node positions of two adjacent sub-sheets. The solving by the magnetic circuit method can obtain the magnetic potential difference convergent solution of the three-dimensional magnetic circuit. The solving way of magnetic circuit method is the same as that of the two-dimensional magnetic circuit method, but the parameters of three-dimensional magnetic circuit include the magnetic reluctance of all sub-sheets and the connected magnetic reluctance between adjacent sub-sheets.

For the first sub-sheet mode, each sub-sheet has its own BH curve because of the different temperatures. When solving the entire nonlinear three-dimensional magnetic circuit, the magnetic circuit in each sub-sheet needs to be iterated according to their respective BH curve in the internal iterative process of the magnetic circuit, but the whole three-dimensional magnetic circuit (including the magnetic reluctance of the above meter and axial magnetic flux) is solved when solving. For the second sub-sheet mode, because the magnetic reluctance structure of each sub-sheet is different, the two-dimensional magnetic circuit structure of each sub-sheet may be different, but even if the magnetic circuit structure is different, the arrangement of the magnetic field node is the same, and the three-dimensional magnetic circuit is connected by the magnetic field node at the same position; this sub-sheet mode is also a solution to the entire three-dimensional magnetic circuit.

Regardless of a two-dimensional magnetic circuit or a three-dimensional magnetic circuit, the solving method of the magnetic circuit method is the same. In the two-dimensional magnetic circuit, the parameters solved by the magnetic circuit method are the magnetic reluctance in the two-dimensional magnetic circuit; in the three-dimensional magnetic circuit, the parameters solved by the magnetic circuit method include, in addition to the magnetic reluctance in each sub-sheet, the connected magnetic reluctance between adjacent sub-sheets, the magnetic reluctance and connected magnetic reluctance in the sub-sheet. These parameters are used as magnetic field distribution parameters of the three-dimensional magnetic circuit.

The present invention has the following advantages. The non-linear machine core is equivalent to the complex of the linear stator and the equivalent current sheet, and the non-linearity of the core is characterized by the equivalent current sheet. The sub-domain method is used to analyze and calculate the linear stator model and calculate the magnetic field distribution of the stator; the magnetic circuit method is used to calculate the nonlinearity of the core to obtain the current density of the equivalent current sheet. The magnetic field distribution obtained by the sub-domain method and the current density obtained by the magnetic circuit method are iterated to finally obtain a stable current density, and thus accurately calculate the magnetic field distribution and electromagnetic performance parameters. With the advantages of the sub-domain method and the magnetic circuit method, the present invention can accurately calculate the magnetic field distribution and electromagnetic performance of the permanent magnet machine in consideration of the saturation effect, with a fast calculation speed and high precision.

In addition, the present invention can be extended to the solution of machine dynamic characteristics. For considering the machine control algorithm, the complex structure of the machine and the material nonlinearity, usually the finite element method and MATLAB SIMULINK are combined for simulation in the prior art, but the solving speed is too slow, usually it will take a few days to complete the simulation. If the present invention combines with MATLAB for simulation, the solving time will be greatly shortened. In addition, the present invention can also be implemented by MATLAB; therefore, it can be integrated into unified software to facilitate operation.

Figure 1:
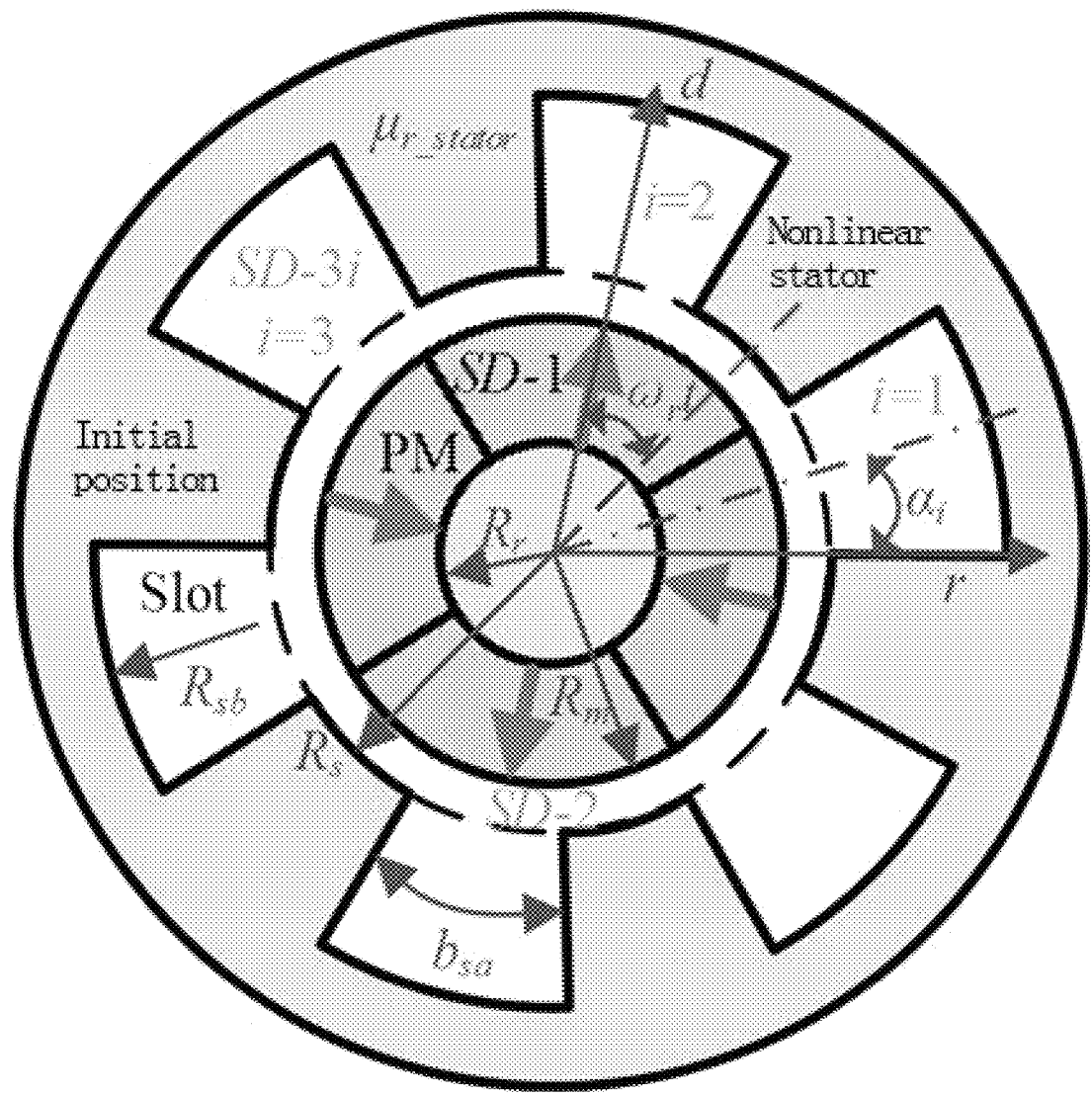
FIG. 1 is a schematic diagram of a model of a nonlinear surface-mounted permanent magnet machine of the present invention.

The foregoing embodiments describe the technical solutions and beneficial effects of the present invention in detail. It should be understood that the above embodiments are only specific embodiments of the present invention and are not intended to limit the present invention.

DETAILED DESCRIPTION

The present invention will be further described in detail with reference to the accompanying drawings and embodiments. It should be noted that the following embodiments are intended to facilitate the understanding of the invention but not to limit the invention.

A method for evaluating electromagnetic performance of a PM machine, establishing an electromagnetic analytical model of the machine, the solution domain of the analytical model being at least divided into a permanent magnet sub-domain, an air gap sub-domain, and a stator slot sub-domain, and calculating the current magnetic field distributions of the air gap sub-domain, stator slot sub-domain and/or permanent magnet sub-domain based on a sub-domain method by the analytical model through a Poisson equation or a Laplace equation; adding an equivalent current sheet to the boundary of the target sub-domain and interface between the target sub-domain and an adjacent sub-domain respectively, representing the boundary condition and interface condition by the current density of the equivalent current sheet, and solving the magnetic field distribution by a sub-domain method; solving the magnetic potential difference of each part of the core by a magnetic circuit method according to the current magnetic field distribution, and converting the magnetic potential difference to a current density of the equivalent current sheet; iterating the magnetic field distribution obtained by the sub-domain method and the current density obtained by the magnetic circuit method until a convergent current density is obtained, solving the magnetic field distribution of the target sub-domain with the convergent current density; calculating the electromagnetic performance parameters based on the magnetic field distribution and evaluating the electromagnetic performance of the machine based on the electromagnetic performance parameters.

The two-dimensional magnetic circuit is used as the target magnetic field of the analytical model, and the solution domain is divided on a 2D plane of the analytical model.

According to the boundary condition and interface condition in each sub-domain, the undetermined coefficients in each sub-domain expression are solved by simultaneous equations, and the equation set is written as a matrix form. There is a matrix inversion process for solving the undetermined coefficients; when the undetermined coefficients are determined, the magnetic field distribution in each sub-domain is obtained.

when solving with the magnetic circuit method, the silicon steel of stator core tooth portion and yoke portion is equivalent to different magnetic reluctance to construct a magnetic network, and the obtained current magnetic field distribution is converted into the magnetic flux into the stator as a magnetic flux source in the magnetic circuit method, to obtain the magnetic potential difference of each stator tooth and stator yoke by solving, the magnetic potential difference of the stator tooth and stator yoke is equivalent to the current density of equivalent current sheets on the slot side and slot bottom. When the magnetic circuit method is used to solve the magnetic potential difference of each stator tooth and stator yoke, a node magnetic potential difference matrix equation is constructed according to kirchhoff's law, and then a convergent solution of the node magnetic potential difference matrix is obtained using Newton-Raphson's law. Where, the node magnetic potential difference matrix equation is:

$$V=(A\Lambda A^T)^{-1}\Phi \qquad (22)$$

where, A is the associated matrix, $\Lambda$ is the branch magnetic reluctance matrix, V is the node magnetic potential difference matrix, $\Phi$ is the node magnetic flux matrix, and the magnetic flux into the stator is obtained by integrating the magnetic flux density and the area in the stator slot and the air gap.

when iteration of the magnetic field distribution obtained by sub-domain method and the current density obtained by magnetic circuit method is performed, the current density of the equivalent current sheet is preset to 0, and the sub-domain method is used to solve the magnetic field distribution for the first time, to obtain the magnetic flux into the stator; then the magnetic potential difference of each tooth portion and yoke portion of the stator is solved by the magnetic circuit method, and the current density value of corresponding equivalent current sheet is obtained by the magnetic potential difference; then current density value is used as a boundary condition of the sub-domain method to resolve; the above iterative process is repeated until the difference between the current density obtained in the previous iteration and the current density obtained in this iteration is within the preset threshold range.

In some embodiments, when considering the saturation of the rotor yoke, a magnetic network is established at the rotor yoke to calculate the current density of the equivalent current sheet between the rotor yoke and the rotor permanent magnet, and the current density is taken as the boundary condition at the interface between the rotor yoke and the rotor permanent magnet.

In some embodiments, the stator slot sub-domain includes a boundary condition of two slot sides and a boundary condition of the slot bottom, and the boundary condition is expressed as:

$$H_{3ri}|\alpha=\alpha_i+b_{sa}/2=J_{i1} \tag{1}$$

$$H_{3ri}|\alpha=\alpha_i-b_{sa}/2=-J_{i2} \tag{2}$$

$$H_{3\alpha i}|r=R_{sb}=-J_{i3} \tag{3}$$

where, $J_{i1}$ is the current density of the equivalent current sheet on the first slot side of the stator slot, $J_{i2}$ is the current density of the equivalent current sheet on the second slot side of the stator slot, $J_{i3}$ is the current density of the equivalent current sheet at the slot bottom of the stator slot.

In some embodiments, the stator slot is a semi-closed slot, the stator slot sub-domain includes boundary conditions of two slot sides and the boundary condition of both sides of the slot opening. The boundary condition is expressed as:
$H_{3ri}|\alpha=\alpha_i+b_{sd}/2=J_{i1}$;  $H_{3ri}|\alpha=\alpha_i-b_{sd}/2=-J_{i2}$; $H_{3\alpha i}|r=R_{sb}=-J_{i3}$; $H_{4ri}|\alpha=\alpha_i+b_{od}/2=J_{i4}$; $H_{4ri}|\alpha=\alpha_i-b_{od}/2=-J_{i5}$;

where, $b_{oa}$ is the width of slot opening, $J_{i1}$ is the current density of the equivalent current sheet on the first slot side of the stator slot, $J_{i2}$ is the current density of the equivalent current sheet on the second slot side of the stator slot, $J_{i3}$ is the current density of the equivalent current sheet at the slot bottom of the stator slot; $J_{i4}$ is the current density of the equivalent current sheet on the first slot side of the stator slot opening, $J_{i5}$ is the current density of the equivalent current sheet on the second slot side of the stator slot opening.

In some embodiments, the permanent magnet pole of the rotor is a consequent-pole, and a soft magnetic material is added between two adjacent permanent magnets. The non-consequent-pole has a permanent magnet sub-domain range of 0-2π, and the range of the consequent-pole machine permanent magnet sub-domain is:

$$\alpha_{im}-\alpha_{mag}/2 \leq \alpha \leq \alpha_{im}+\alpha_{mag}/2$$

Where, $\alpha_{mag}$ is the width angle of the permanent magnet, $\alpha_{im}$ is the center line of the i-th permanent magnet.

Compared to the non-consequent-pole structure, the consequent-pole rotor permanent magnet sub-domain is added with the boundary condition on the interface with the adjacent soft magnetic material, and the boundary condition is represented by the magnetic flux density:

$$B_{rmi}|_{\alpha=\alpha im\pm\alpha mag/2}=0.$$

Example 1: Electromagnetic Analytical Model of a Surface-Mounted Permanent Magnet Machine As shown in FIG. 1, the present invention is applied to a surface-mounted permanent magnet machine electromagnetic design, and a 4-pole 6-slot surface-mounted permanent magnet machine is taken as an example, but the number of pole slots of the machine is not limited to the examples of this embodiment. The stator of the surface-mounted permanent magnet machine herein is a nonlinear silicon steel, SD-1, SD-2 and SD-3 are sub-domains of permanent magnets, air gap and stator slot, $\omega_r$ is the rotor rotational angular velocity, and $\alpha_i$ is the angle of the centerline of the i-th slot, r and α are the radial and tangential positions in the polar coordinate system, $b_{sa}$ is the width of slot opening, $R_r$, $R_m$, $R_s$ and $R_{sb}$ are the radius of rotor yoke, the permanent magnet surface, the slot top, and slot bottom to the center of the circle respectively, $\alpha_0$ is the initial angle of the rotor, k and n are the number of harmonics on the circumference and the slot opening, respectively, and p is the number of poles of the permanent magnet.

Figure 2:
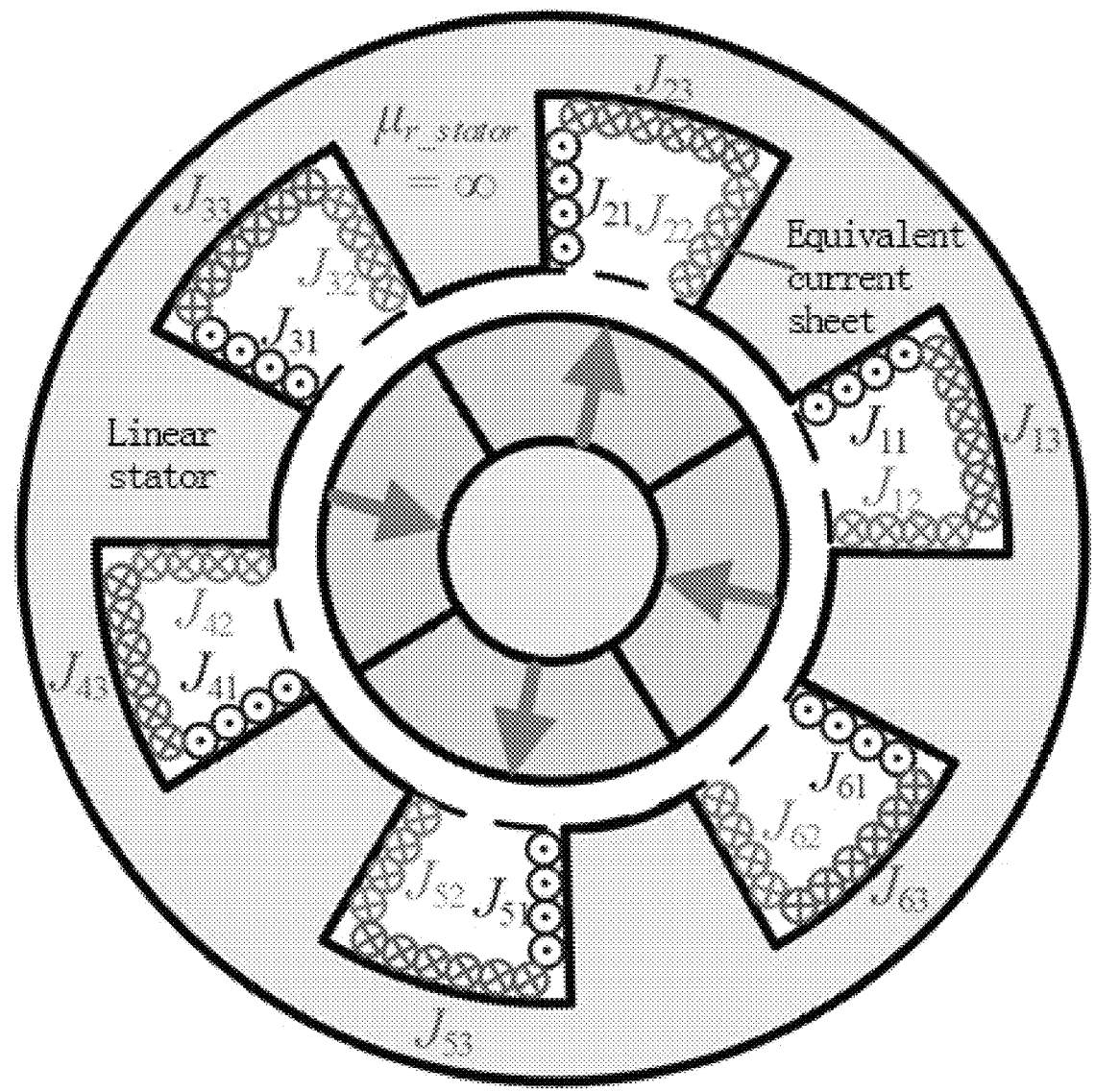
FIG. 2 is a nonlinear composite model in which an equivalent current sheet is added as a boundary condition.
Figure 3:
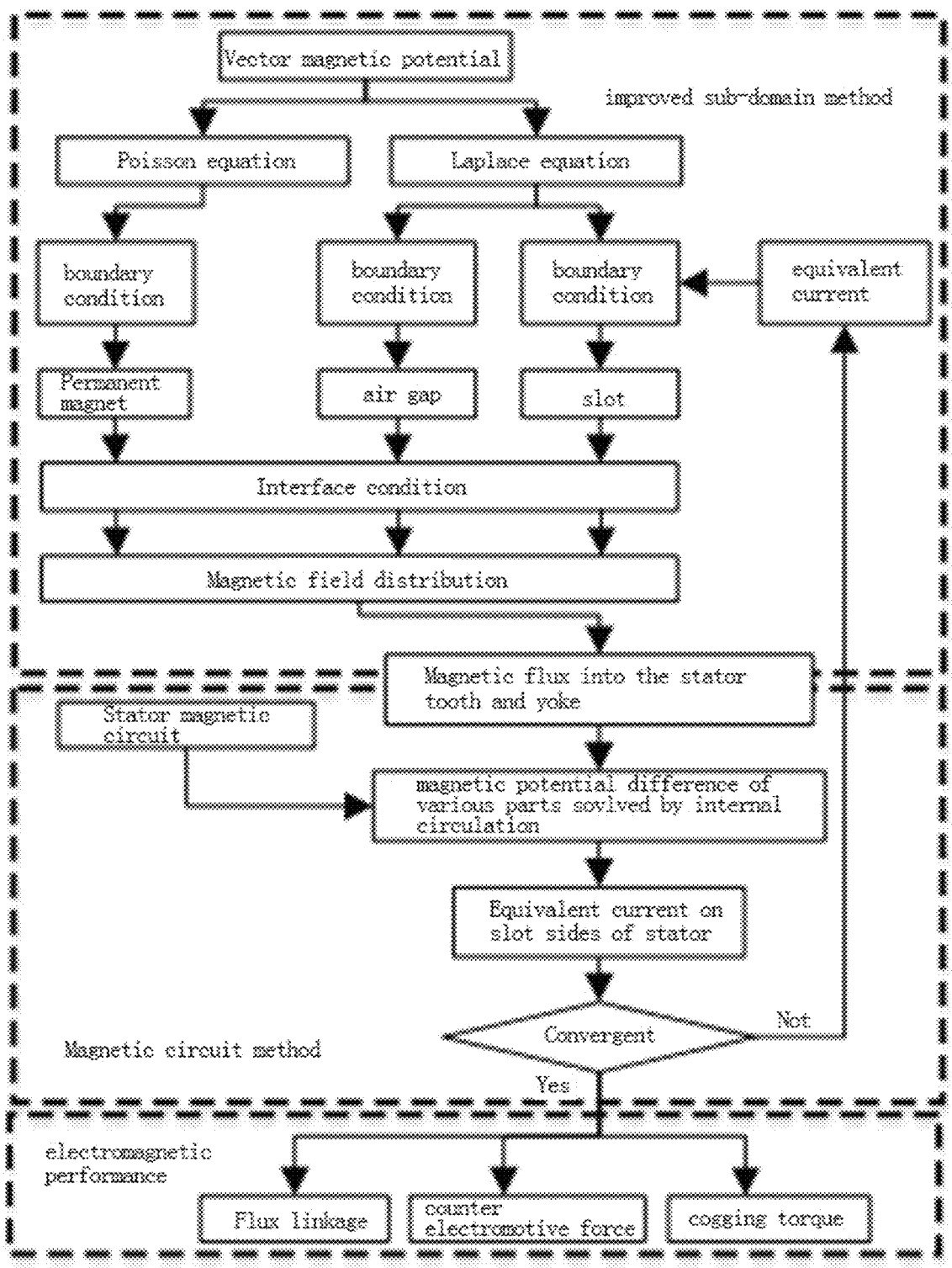
FIG. 3 is a flow chart of a solving method of the present invention when used in electromagnetic design no-load condition of a surface-mounted permanent magnet machine.

In this embodiment, when the sub-domain method is used to establish the vector magnetic potential model of the sub-domain, the equivalent current sheet is added as a boundary condition on both slot sides and the slot bottom of the stator slot, so that the vector magnetic potential expression of the stator slot is associated with the current density of the equivalent current sheet, for details, refer to FIGS. 2 and 3, the equivalent current sheets of the slot side are Ji1 and Ji2, and the equivalent current sheet of the slot bottom is Ji3, where, i=1, 2, 3 . . . the nonlinearity of the stator is reflected by the current sheet, therefore, the stator silicon steel can be considered linear at this time.

Based on the result of the sub-domain method, the magnetic circuit method is used to solve the magnetic potential difference of each part of the stator, and is converted into the current density of the equivalent current sheet in the slot. Then iteration is performed by the sub-domain method and magnetic circuit method, to calculate the convergent solution of the magnetic field distribution of each sub-domain. Based on the convergence result, electromagnetic performance such as permanent magnet machine flux linkage, counter electromotive force, cogging torque, terminal voltage, electromagnetic torque, and unbalance force are calculated.

Taking the surface-mounted open slot internal rotor machine as an example, the specific calculation of the sub-domain method is as follows:

By solving the Poisson equation and Laplace equation and applying the boundary condition, the expressions of the vector magnetic potential Az1 in the permanent magnet and the vector magnetic potential Az2 in the air gap are as follows:

$$A_{z1} = \sum_k (C_{1k}A_1 + C_{2k}M_{\alpha ck} - C_{3k}M_{rsk})\cos(k\alpha) + \tag{1}$$

$$\sum_k (C_{1k}C_1 + C_{2k}M_{\alpha sk} + C_{3k}M_{rck})\sin(k\alpha)$$

$$A_{z2} = \sum_k [A_1(r/R_s)^k + B_2(r/R_m)^{-k}]\cos(k\alpha) + \tag{2}$$

$$\sum_k [C_2(r/R_s)^k + D_2(r/R_m)^{-k}]\sin(k\alpha)$$

Thus, the radial magnetic flux density $B_{1r}$ and the tangential magnetic flux density $B_{1\alpha}$ in the permanent magnet can be solved as follows:

$$B_{1r} = -\sum_k (k/r)\cdot(C_{1k}A_1 + C_{2k}M_{\alpha ck} - C_{3k}M_{rsk})\sin(k\alpha) + \qquad (3)$$
$$\sum_k (k/r)\cdot(C_{1k}C_1 + C_{2k}M_{\alpha sk} + C_{3k}M_{rck})\cos(k\alpha)$$

$$B_{1\alpha} = -\sum_k (1/r)\cdot(C_{4k}A_1 + C_{5k}M_{\alpha ck} - C_{6k}M_{rsk})\cos(k\alpha) - \qquad (4)$$
$$\sum_k (1/r)\cdot(C_{4k}C_1 + C_{5k}M_{\alpha sk} + C_{6k}M_{rck})\sin(k\alpha)$$

The radial magnetic flux density $B_{2r}$ and the tangential magnetic flux density $B_{2\alpha}$ in the air gap are:

$$B_{2r} = -\sum_k (k/r)\cdot\left[A_2(r/R_s)^k + B_2(r/R_m)^{-k}\right]\sin(k\alpha) + \qquad (5)$$
$$\sum_k (k/r)\cdot\left[C_2(r/R_s)^k + D_2(r/R_m)^{-k}\right]\cos(k\alpha)$$

$$B_{2\alpha} = -\sum_k (k/r)\cdot\left[A_2(r/R_s)^k - B_2(r/R_m)^{-k}\right]\cos(k\alpha) - \qquad (6)$$
$$\sum_k (k/r)\cdot\left[C_2(r/R_s)^k - D_2(r/R_m)^{-k}\right]\sin(k\alpha)$$

Where, $A_1$, $B_1$, $A_2$, $B_2$, $C_2$ and $D_2$ are undetermined coefficients, $M_{rsk}$, $M_{rck}$, $M_{\alpha sk}$, and $M_{\alpha ck}$ are magnetization components of the permanent magnet:

$$M_{rck} = M_{rk}\cos(k\omega_r t + k\alpha_0) \qquad (7)$$
$$M_{rsk} = M_{rk}\sin(k\omega_r t + k\alpha_0) \qquad (8)$$
$$M_{\alpha ck} = -M_{\alpha k}\sin(k\omega_r t + k\alpha_0) \qquad (9)$$
$$M_{\alpha sk} = M_{\alpha k}\cos(k\omega_r t + k\alpha_0) \qquad (10)$$

For radial magnetization:
$$M_{rk} = (4pB_r/k\pi\mu_0)\sin(k\pi\alpha_p/2p), k/p=1,3,5, \qquad (11)$$
$$M_{\alpha k} = 0, k/p=1,3,5, \qquad (12)$$

For tangential magnetization:
$$M_{rk} = (B_r/\mu_0)\alpha_p(A_{1k}+A_{2k}), k/p=1,3,5, \qquad (13)$$
$$M_{\alpha k} = (B_r/\mu_0)\alpha_p(A_{1k}-A_{2k}), k/p=1,3,5, \qquad (14)$$

Other coefficients:

$$C_{1k} = \left[(r/R_m)^k + G_1(r/R_r)^{-k}\right] \qquad (15)$$

$$C_{2k} = \frac{\mu_0}{k^2-1}\left[R_r k\left(\frac{r}{R_r}\right)^{-k} + r\right] \qquad (16)$$

$$C_{3k} = \frac{\mu_0}{k^2-1}\left[R_r\left(\frac{r}{R_r}\right)^{-k} + kr\right] \qquad (17)$$

$$C_{4k} = k\left[(r/R_m)^k - G_1(r/R_r)^{-k}\right] \qquad (18)$$

$$C_{5k} = \frac{\mu_0}{k^2-1}\left[-k^2 R_r\left(\frac{r}{R_r}\right)^{-k} + r\right] \qquad (19)$$

$$C_{6k} = \frac{\mu_0 k}{k^2-1}\left[-R_r\left(\frac{r}{R_r}\right)^{-k} + r\right] \qquad (20)$$

$$G_1 = (R_r/R_m)^k \qquad (21)$$

The vector magnetic potential $A_{z3}$ in the slot satisfies the Poisson equation. If it is no-load, the current density of the armature in the equation is set to 0, and its boundary condition can be expressed as:

$$H_{3ri}|\alpha=\alpha_i+b_{sa}/2 = J_{i1} \qquad (22)$$
$$H_{3ri}|\alpha=\alpha_i-b_{sa}/2 = -J_{i2} \qquad (23)$$
$$H_{3\alpha i}|r=R_{sb} = -J_{i3} \qquad (24)$$

where, $J_{i1}$, $J_{i2}$ and $J_{i3}$ are the current density of equivalent current sheets on three sides of the slot, the value of which is determined by the magnetic circuit method.

The expression formula for a vector magnetic potential of non-overlapping winding stator slot is:

$$A_{z3i}(r,\alpha) = \sum_n A_{z3in}\cos[E_n(\alpha + b_{sa}/2 - \alpha_i)] + A_{z3i0} \qquad (25)$$

where, $$A_{z3in} = \left(B_{3n}G_3 - \frac{E_n W_n R_{sb}}{(1-E_n^2)} - \frac{2\mu_0 J_{amn}R_{sb}^2}{E_n(E_n^2-4)}\right)\left(\frac{r}{R_{sb}}\right)^{E_n} + \qquad (26)$$
$$B_{3n}\left(\frac{r}{R_s}\right)^{-E_n} + \frac{rE_n^2 W_n}{1-E_n^2} + \frac{\mu_0 J_{amn}r^2}{E_n^2-4}$$

$$A_{z3i0} = \mu_0 J_{am0}(2R_{sb}^2\ln r - r^2)/4 + C_i\ln r - \mu_0(J_{i1}+J_{i2})r/b_{sa} + Q_{3i} \qquad (27)$$

$$E_n = n\pi/b_{sa} \qquad (28)$$

$$G_3 = (R_s/R_{sb})^{E_n} \qquad (29)$$

$$W_n = 2\mu_0\{-(J_{i1}+J_{i2})(-1)^n + J_{i2}[(-1)^n-1]\}/(E_n^2 b_{sa}) \qquad (30)$$

$$C_i = R_{sb}\left[\mu_0 J_{i3} + \mu_0(J_{i1}+J_{i2})/b_{sa}\right] \qquad (31)$$

$$J_{iam0} = (J_{iam1}+J_{iam2})/2 \qquad (32)$$

$$J_{iamn} = 2(J_{iam1}-J_{iam2})\sin(n\pi/2)/(n\pi) \qquad (33)$$

Where, $\alpha_i$ is the angle of the centerline of the i-th groove, r and $\alpha$ are the radial and tangential positions in the polar coordinate system, $b_{sa}$ is the width of slot opening, $R_s$ and $R_{sb}$ are the radius of the slot top and the slot bottom to the center of the circle, respectively. $J_{ami1}$ and $J_{ami2}$ are the current density of the two coil sides in the i-th slot. If it is no-load, the current density of the coil is 0, and $B_{3in}$ and $Q_{3i}$ are undetermined coefficients.

Then the radial magnetic flux density and the tangential magnetic flux density are:

$$B_{3ir} = \sum_n B_{3irn}\sin[E_n(\alpha + b_{sa}/2 - \alpha_i)] \qquad (34)$$

$$B_{3i\alpha}(r,\alpha) = \sum_n B_{3i\alpha n}\cos[E_n(\alpha + b_{sa}/2 - \alpha_i)] + B_{3i\alpha 0} \qquad (35)$$

where:

$$B_{3irn} = -E_n\left\{\frac{E_n^2 W_n}{(1-E_n^2)} + \frac{\mu_0 J_{amn} r}{E_n^2 - 4} + \right.$$
$$\left.\frac{B_{3n}}{R_s}\left(\frac{r}{R_s}\right)^{-E_n-1} + \left[\frac{B_{3n}G_3}{R_{sb}} - \frac{E_n W_n}{(1-E_n^2)} - \frac{2\mu_0 J_{amn} R_{sb}}{E_n(E_n^2-4)}\right]\left(\frac{r}{R_{sb}}\right)^{E_n-1}\right\} \quad (36)$$

$$B_{3ian} = -\left[\left(\frac{B_{3n}E_n G_3}{R_{sb}} - \frac{E_n^2 W_n}{1-E_n^2} - \frac{2\mu_0 R_{sb} J_{amn}}{E_n^2-4}\right)\left(\frac{r}{R_{sb}}\right)^{E_n-1} - \right.$$
$$\left.\frac{B_{3n}E_n}{R_s}\left(\frac{r}{R_s}\right)^{-E_n-1} + \frac{E_n^2 W_n}{1-E_n^2} + \frac{2\mu_0 J_{amn} r}{E_n^2-4}\right] \quad (37)$$

$$B_{3ia0} = -\frac{\mu_0 J_{am0}(R_{sb}^2/r - r)}{2} - \frac{C_i}{r} + \frac{\mu_0(J_{i1}+J_{i2})}{b_{sa}} \quad (38)$$

For overlapping windings, the vector magnetic potential expression for the slot bottom is:

$$A_{zb3i}(r,\alpha) = \sum_n A_{zb3in}\cos[E_n(\alpha + b_{sa}/2 - \alpha_i)] + A_{zb3i0} \quad (39)$$

where, $$A_{zb3i0} = -\mu_0(J_{i1}+J_{i2})r/b_{sa} + C_i \ln r + \mu_0 J_{iam2}$$
$$(2R_{sb}^2 \ln r - r^2)/4 + Q_{3bi} \quad (40)$$

$$A_{zb3in} = B_{3n}G_3 - E_n W_n R_{sb}/(1-E_n^2))(r/R_{sb})^{E_a} + B_{3n}$$
$$(r/R_s)^{-E_a} + rE_n^2 W_n/(1-E_n^2) \quad (41)$$

radial magnetic flux density of slot bottom is:

$$B_{b3ir} = \sum_n B_{b3irn}\sin[E_n(\alpha + b_{sa}/2 - \alpha_i)] \quad (42)$$

magnetic flux density of slot bottom is:

$$B_{b3ia} = \sum_n B_{b3ian}\cos[E_n(\alpha + b_{sa}/2 - \alpha_i)] + B_{b3ia0} \quad (43)$$

Where $$B_{b3irn} = (E_r/r)[(B_{3n}G_3 - E_n W_n R_{sb}/(1-E_n^2))(r/R_{sb})^{E_a} + B_{3n}$$
$$(r/R_s)^{-E_a} + rE_n^2 W_n/(1-E_n^2)] \quad (44)$$

$$B_{b3ian} = -(E_n/r)[(B_{3n}G_3 - E_n W_n R_{sb}/(1-E_n^2))(r/R_{sb})^{E_a} - B_{3n}(r/R_s)^{-E_a} + rE_n W_n/(1-E_n^2)] \quad (45)$$

$$B_{b3ia0} = \mu_0(J_{i1}+J_{i2})/b_{sa} - C_i/r - \mu_0 J_{iam2}(R_{sb}^2/r - r)/2 \quad (46)$$

The vector magnetic potential expression of the slot top is:

$$A_{zt3i}(r,\alpha) = \sum_n A_{zt3in}\cos[E_n(\alpha + b_{sa}/2 - \alpha_i)] + A_{zt3i0} \quad (47)$$

where, $$A_{zt3i0} = \mu_0 r(J_{i1}+J_{i2})/b_{sa} + C_i \ln r + C_{ti} \ln r - \mu_0 J_{iam1} r^2/4 + Q_{3ti} \quad (48)$$

$$A_{zt3in} = (B_{3tn}G_3 - E_n W_n B_{sb}/(1-E_n^2))(r/B_{sb})^{E_n} + B_{3tn}(r/B_s)^{-E_n} + rE_n^2 W_n/(1-E_n^2) \quad (49)$$

$$B_{3tn} = B_{3n} \quad (50)$$

$$C_{ti} = \mu_0 J_{iam1} R_{sm}^2/2 + \mu_0 J_{iam2}(R_{sb}^2 - R_{sm}^2)/2 \quad (51)$$

$$Q_{3bi} = Q_{3ti} - C_{ti} \ln R_{sm} - \mu_0 J_{iam1} R_{sm}^2/4 - \mu_0 J_{iam2}(2R_{sb}^2 \ln R_{sm} - R_{sm}^2)/4 \quad (52)$$

The radial magnetic flux density and tangential magnetic flux density of the slot top are:

$$B_{t3ir} = \sum_n B_{t3irn}\sin[E_n(\alpha + b_{sa}/2 - \alpha_i)] \quad (53)$$

$$B_{t3ia} = \sum_n B_{t3ian}\cos[E_n(\alpha + b_{sa}/2 - \alpha_i)] + B_{t3ia0} \quad (54)$$

$$B_{t3irn} = B_{b3irn}, B_{t3ian} = B_{b3ian} \quad (55)$$

$$B_{t3ia0} = \mu_0(J_{i1}+J_{i2})/b_{sa} - (C_i + C_{ti})/r + \mu_0 J_{iam1} r/2 \quad (56)$$

Using boundary condition, the undetermined coefficients in the above three domains can be solved by a matrix equation:

$$\begin{bmatrix} K_{11} & 0 & K_{13} & K_{14} & 0 & 0 & 0 \\ 0 & K_{22} & 0 & 0 & K_{25} & K_{26} & 0 \\ K_{31} & 0 & K_{33} & K_{34} & 0 & 0 & 0 \\ 0 & K_{42} & 0 & 0 & K_{45} & K_{46} & 0 \\ 0 & 0 & K_{53} & K_{54} & 0 & 0 & K_{57} \\ 0 & 0 & 0 & 0 & K_{65} & K_{66} & K_{67} \\ 0 & 0 & K_{73} & K_{74} & K_{75} & K_{76} & K_{77} \end{bmatrix} \begin{bmatrix} A_1 \\ C_1 \\ A_2 \\ B_2 \\ C_2 \\ D_2 \\ B_{3T} \end{bmatrix} = \begin{bmatrix} Y_1 \\ Y_1 \\ Y_3 \\ Y_4 \\ Y_5 \\ Y_6 \\ Y_7 \end{bmatrix} \quad (57)$$

Till now, the magnetic field distributions inside the permanent magnet, and in the air gap and stator slot have been solved.

The specific process of the step 2): the silicon steel of stator core tooth portion and yoke portion is equivalent to different magnetic reluctance to construct a magnetic network, and the obtained current magnetic field distribution is converted into the magnetic flux into the stator as a magnetic flux source in the magnetic circuit method, to obtain the magnetic potential difference of each stator tooth and stator yoke by solving, the magnetic potential difference of the stator tooth and stator yoke is equivalent to the current density of equivalent current sheets on the slot side and slot bottom.

When the magnetic circuit method is used to solve the magnetic potential difference of each stator tooth and stator yoke, a node magnetic potential difference matrix equation is constructed according to kirchhoff's law, and then a convergent solution of the node magnetic potential difference matrix is obtained using Newton-Raphson's law. Where, the node magnetic potential difference matrix equation is:

$$V = (A\Lambda A^T)^{-1}\Phi \quad (58)$$

where, A is the associated matrix, Λ is the branch magnetic reluctance matrix, V is the node magnetic potential difference matrix, Φ is the node magnetic flux matrix, and the magnetic flux into the stator is obtained by integrating the magnetic flux density and the area in the stator slot and the air gap.

In the step of iteration in the magnetic circuit method and the sub-domain method, the current density of the equivalent current sheet is preset to 0, and the sub-domain method is used to solve the magnetic field distribution for the first time, to obtain the magnetic flux into the stator; then the magnetic potential difference of each tooth portion and yoke portion of the stator is solved by the magnetic circuit method, and the current density value of corresponding equivalent current sheet is obtained by the magnetic potential difference; then current density value is used as a boundary condition of the sub-domain method to resolve; the above iterative process is repeated until a stable current density of the equivalent current sheet is obtained.

After obtaining a stable current density value of the equivalent current sheet, the flux linkage, counter electromotive force, the cogging torque of the permanent magnet machine can be calculated under no-load condition; and under load conditions, the terminal voltage, total torque and other electromagnetic performance of the permanent magnet machine can be calculated. The main process is as follows:

The calculation of the machine flux linkage is divided into two cases: non-overlapping winding and overlapping winding. In the non-overlapping winding, the corresponding flux linkages of the two coil sides in one slot are:

$$\psi_{i1} = l_{ef}(N_c/A_c)\left[Z_0 d + \sum_n (Z_n/E_n)\sin(E_n d)\right] \quad (59)$$

$$\psi_{i2} = l_{ef}(N_c/A_c)\left[Z_0 d - \sum_n (Z_n/E_n)\sin(n\pi - E_n d)\right] \quad (60)$$

Where $$Z_0 = (R_{sb}^2 - R_s^2)gQ_{3i}/2 - \mu_0(J_{i1}+J_{i2})(R_{sb}^3 - R_s^3)/(3b_{sa}) + C_i[2R_{sb}^2 \ln R_{sb} - 2R_s^2 \ln R_s + R_s^2 - R_{sb}^2]/4 \quad (61)$$

$$Z_n = [B_{3in}G_3 - E_n W_{in} R_{sb}/(1-E_n^2)]g(R_{sb}^2 - G_3 R_s^2)/(E_n+2) + B_{3in}(R_{sb}^2 G_3 - R_s^2)/(2-E_n) + E_n^2 W_{in}(R_{sb}^3 - R_s^3)/[3(1-E_n^2)] \quad (62)$$

where, $N_c$ is the number of turns per coil, $A_c$ is the area of one coil side, and d is the width of the coil side.

In the overlapping winding, the corresponding magnetic fluxes of the two coil sides in one slot are:

$$\psi_{i1} = l_{ef}(N_c/A_c)b_{sa}Z_{t0} \quad (63)$$

$$\psi_{i2} = l_{ef}(N_c/A_c)b_{sa}Z_{b0} \quad (64)$$

Where $$Z_{b0} = -\mu_0(J_{i1}-J_{i2})(R_{sb}^3 - R_{sm}^3)/(3b_{sa}) + (R_{sb}^2 - R_{sm}^2)Q_{3i}/2 + C_i[2R_{sb}^2 \ln R_{sb} - 2R_{sm}^2 \ln R_{sm} + R_{sm}^2 - R_{sb}^2]/4 \quad (65)$$

$$Z_{t0} = -\mu_0(J_{i1}+J_{i2})(R_{sm}^3 - R_s^3)/(3b_{sa}) + (R_{sm}^2 - R_s^2)Q_{3i}/2 + C_i[2R_{sm}^2 \ln R_{sm} - 2R_s^2 \ln R_s + R_s^2 - R_{sm}^2]/4 \quad (66)$$

The counter electromotive force is calculated by:

$$E_{ph} = -\frac{d\psi_{ph}}{dt} \quad ph = A, B, C. \quad (67)$$

where, $\psi_{ph}$ is the total flux linkage of a phase, which is obtained by superimposing the flux linkages of all relevant coil sides.

The torque algorithm is the Maxwell tensor method, namely:

$$T_c = (\pi l_a r^2/\mu_0)\sum_k (B_{rck}B_{\alpha ck} + B_{rsk}B_{\alpha sk}) \quad (68)$$

The algorithm for the unbalanced forces between the horizontal and vertical directions is:

$$F_x = rl_a \int_0^{2\pi} \sigma \cos \alpha d\alpha + -rl_a \int_0^{2\pi} \tau \sin \alpha d\alpha \quad (69)$$

$$F_y = rl_a \int_0^{2\pi} \sigma \sin \alpha d\alpha + rl_a \int_0^{2\pi} \tau \cos \alpha d\alpha \quad (70)$$

where:

$$\sigma = (B_r^2 - B_\alpha^2)/(2\mu_0) \quad (71)$$

$$\tau = (B_r \cdot B_\alpha)/\mu_0 \quad (72)$$

In the calculation process of the present invention, for a conventional permanent magnet machine whose rotor dose not saturate, the rotor yoke is regarded as infinite permeability to simplify the model and speed up the solving; for some unconventional permanent magnet machines that need to consider the rotator saturation, similar to the stator, an equivalent current sheet is added between the permanent magnet and the rotor yoke to replace the magnetic potential difference of the rotor yoke.

In order to verify the correctness of the proposed algorithm, in this embodiment, the no-load and load conditions of one set of 8-pole 24-slot surface-mounted permanent magnet machine are calculated respectively, and its main parameters are shown in Table 1. The calculation results are compared with the results obtained by the two-dimensional finite element calculation program.

TABLE 1

| Parameter | Prototype | Unit |
| --- | --- | --- |
| Stator outer diameter | 50 | mm |
| Stator inner diameter | 27.85 | mm |
| Thickens of permanent magnet | 3.5 | mm |
| Rotor outer diameter | 27.35 | mm |
| Armature length | 50 | mm |
| Width of stator tooth | 3.16 | mm |
| Height of stator yoke | 3.2 | mm |
| Polar arc coefficient | 1 | |
| Permanent magnet remanence | 1.20 | T |
| Relative recovery permeability of permanent magnet | 1.05 | |
| Magnetization direction | Parallel magnetization | |
| Rated speed | 400 | rpm |
| Number of pole pairs | 4 | |
| Number of slots | 24 | |
| Rated current (peak) | 6.36 | A |
| Type of silicon steel sheet | WG35WW300 | |

Figure 4:
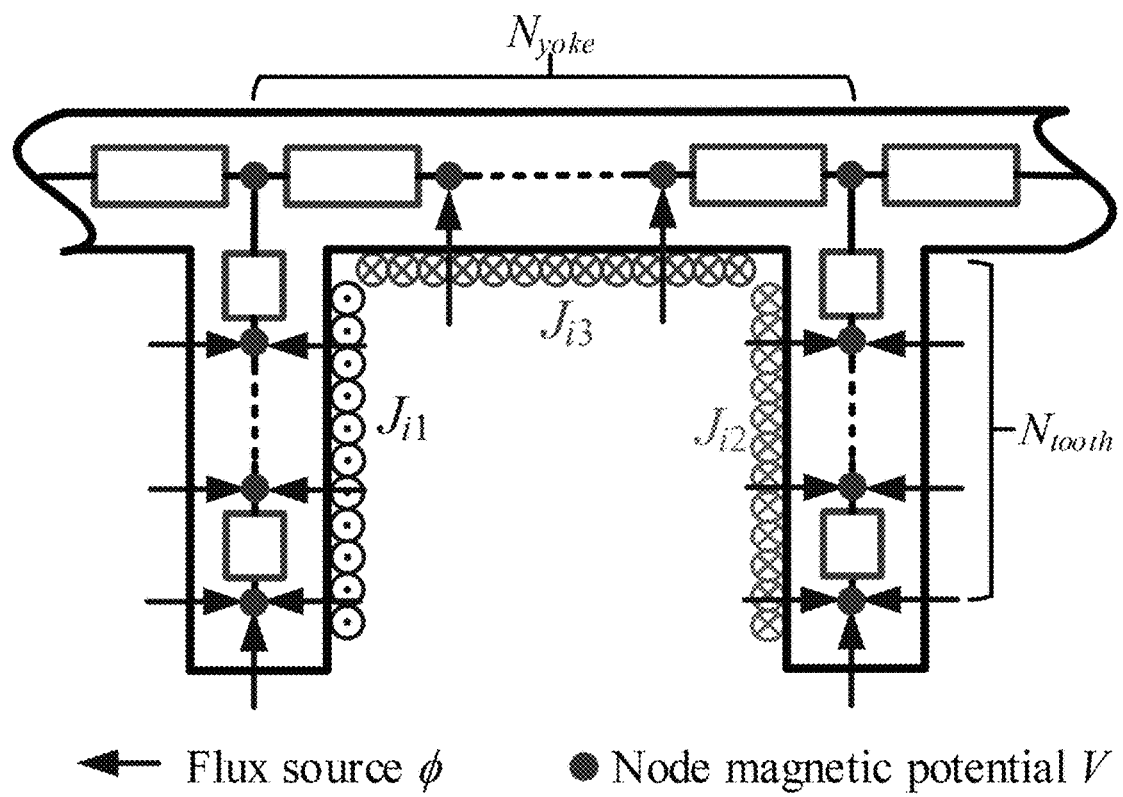
FIG. 4 shows a magnetic circuit of variable magnetic reluctance numbers used by the magnetic circuit method in the embodiment of the present invention. The more severity the saturation condition, the more magnetic reluctance numbers selected.
Figure 5:
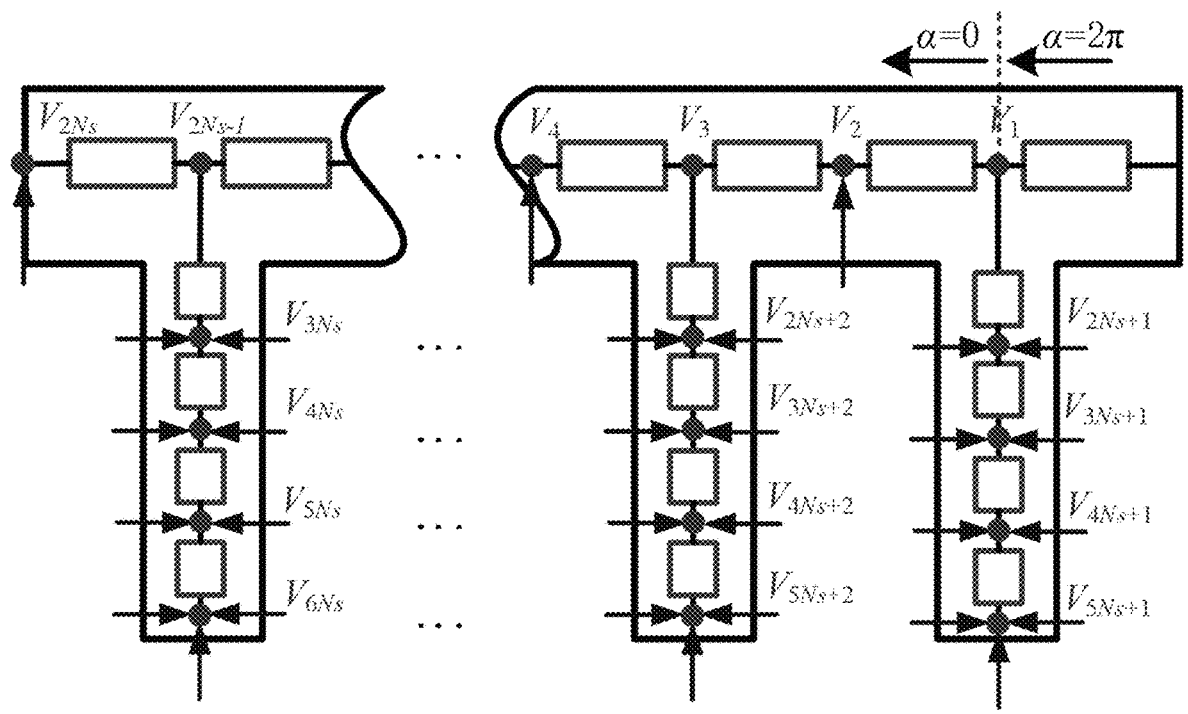
FIG. 5 shows a correspondence relationship between the equivalent current sheet current density and the magnetic potential difference of the magnetic circuit used under load conditions according to the embodiment of the present invention.

Four methods are used for electromagnetic analysis and solution of the machine, respectively the present invention, the finite element nonlinear algorithm, the sub-domain method, and the finite element linear algorithm. For the magnetic circuit model of the variable magnetic reluctance number used in the present invention, refer to FIG. 4. Where, the stator silicon steel is divided into a tooth portion and a yoke portion, which are all equivalent to equivalent resistance. The number of equivalent magnetic reluctances can be determined by the saturation of the stator, and the magnetic flux φ entering from the air gap and slot is determined by the sub-domain, and the convergence result is obtained by the Kirchhoff's law and Newton-Raphson method, to obtain the node voltage of each node. FIG. 5 shows the correspondence relationship between the equivalent current sheet current density and the magnetic potential difference.

$$J_{i1}=(V_{5Ns+i+1}-V_{2i+1})/(R_{sb}-R_s) \quad (73)$$

$$J_{i2}=(V_{2i-1}-V_{5Ns+i})/(R_{sb}-R_s) \quad (74)$$

$$J_{i3}=(V_{2i+1}-V_{2i-1})/(R_{sb} \cdot b_{sa}) \quad (75)$$

The present invention improves the traditional sub-domain method and combines it with the magnetic circuit method. The improved sub-domain method is used to accurately calculate the magnetic field distribution in permanent magnets, air gaps and slots, and then integration of the magnetic flux density and its area entering the stator is performed, converted to magnetic flux. The magnetic flux is used as the input of the magnetic circuit, to analyze the saturation of the stator. According to different saturation situations, that is, the different magnetic potential difference of the tooth portion and the yoke portion, the current density of the equivalent current sheet is solved, and the current density is used as the input of the improved magnetic circuit method to solve the magnetic field distribution. Therefore, the algorithm proposed in this patent has an iterative process, and the convergent solution is a magnetic field distribution in consideration of the nonlinearity of the stator silicon steel sheet.

Figure 6:
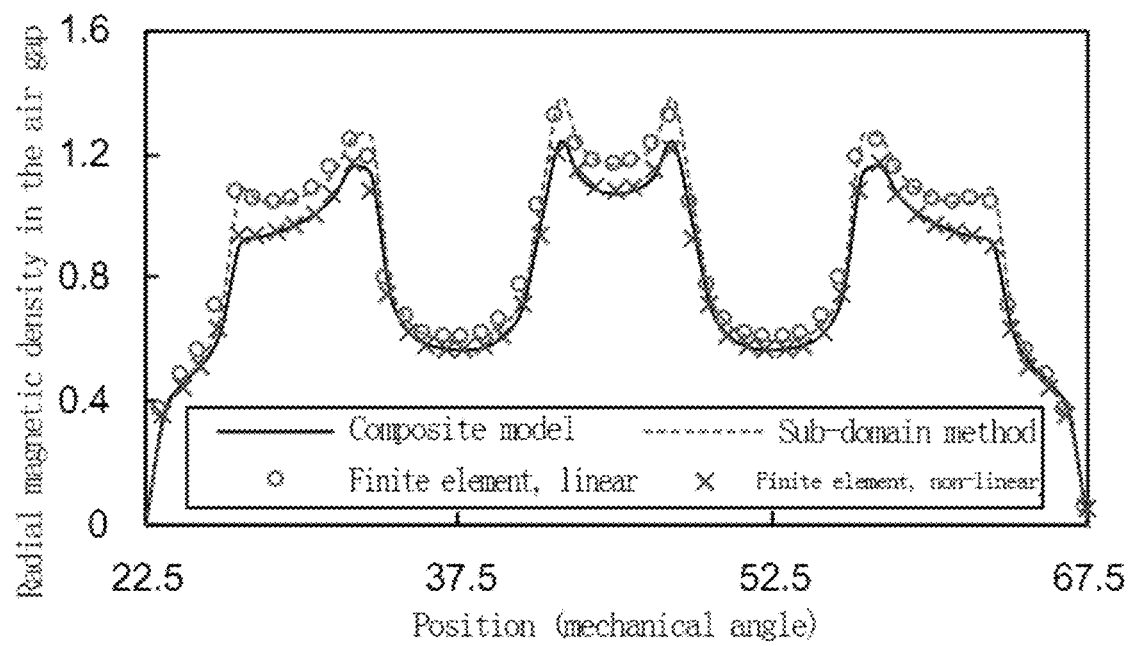
FIG. 6 is a schematic diagram for comparing the predicted radial magnetic flux density in the air gap under no-load conditions between the present invention and other three methods.
Figure 7:
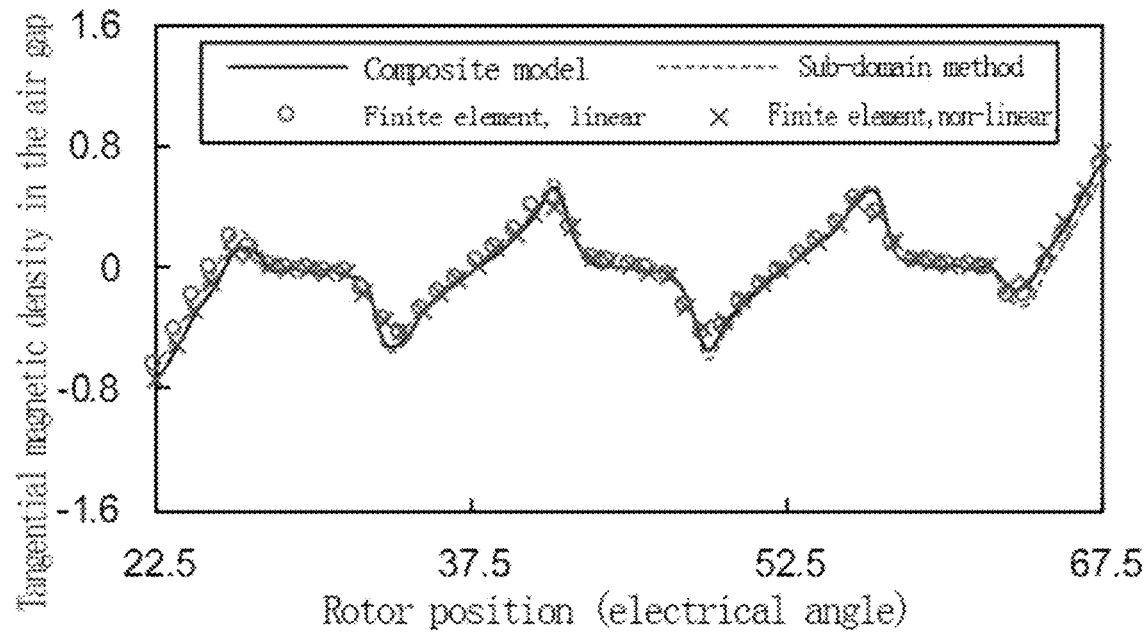
FIG. 7 is a schematic diagram for comparing the predicted tangential magnetic flux density in the air gap under no-load conditions between the present invention and other three methods.
Figure 8:
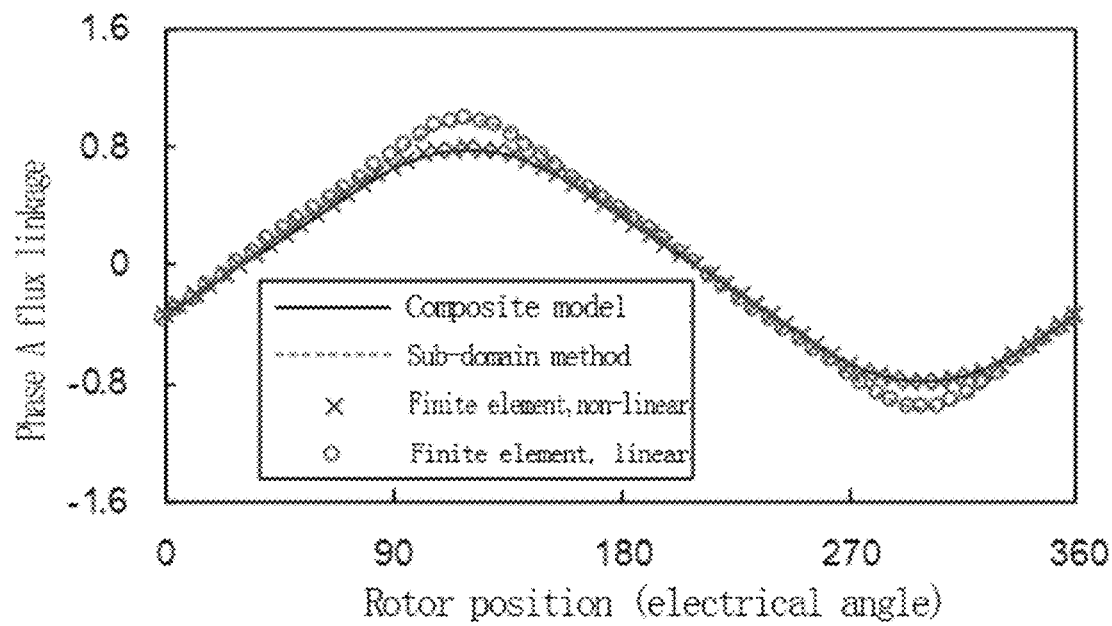
FIG. 8 is a schematic diagram comparing the predicted A-phase flux linkage under no-load conditions between the present invention and other three methods.
Figure 9:
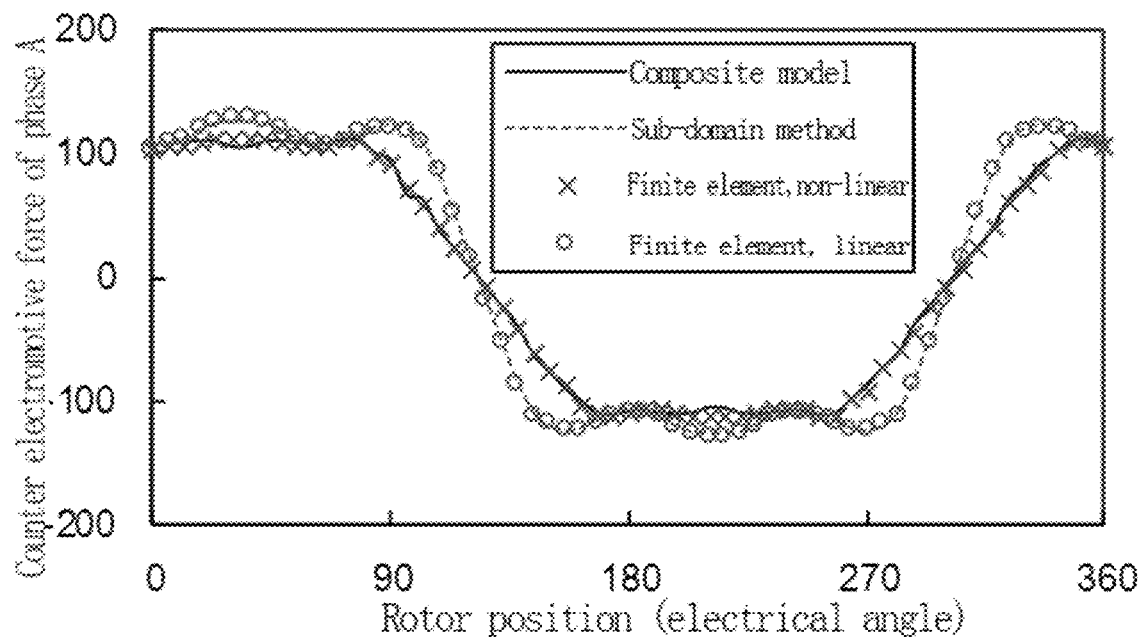
FIG. 9 is a schematic diagram for comparing the predicted A-phase counter electromotive force under no-load conditions between the present invention and other three methods.
Figure 10:
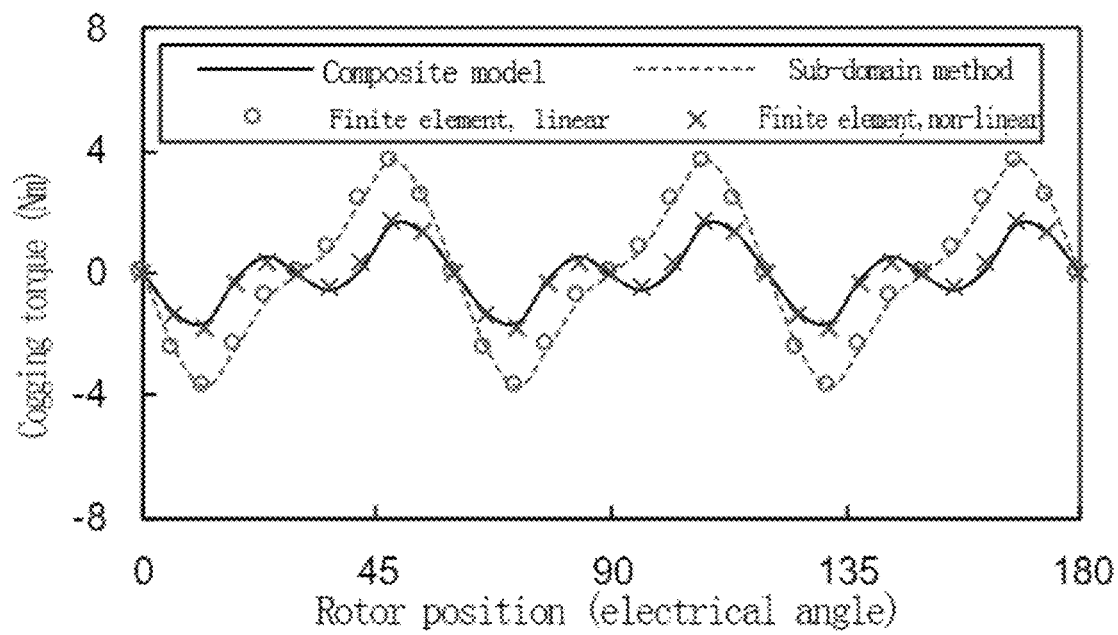
FIG. 10 is a schematic diagram for comparing the predicted cogging torque under no-load conditions between the present invention and other three methods.

The no-load magnetic field analysis results obtained by the four methods are shown in FIG. 6 to IG.10. FIG. 6 and FIG. 7 show the radial magnetic flux density and tangential magnetic flux density in the air gap predicted by the four methods. FIG. 8, FIG. 9 and FIG. 10 are A-phase flux linkage, A-phase counter electromotive force, and cogging torque predicted by four methods.

Figure 11:
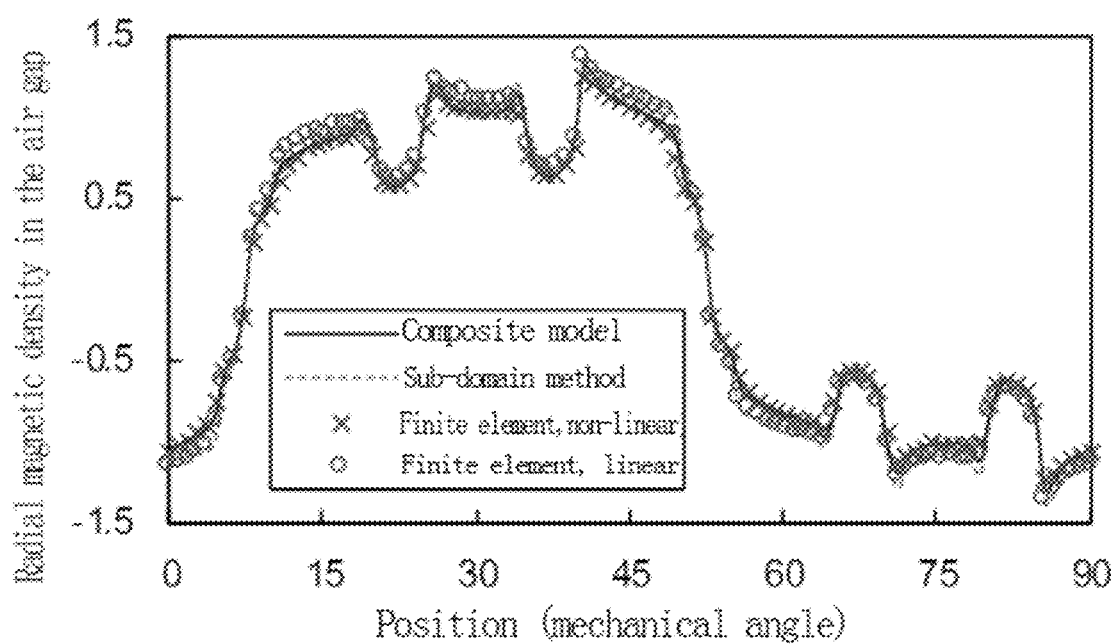
FIG. 11 is a schematic diagram for comparing the predicted radial magnetic flux density in the air gap under load conditions between the present invention and other three methods.
Figure 12:
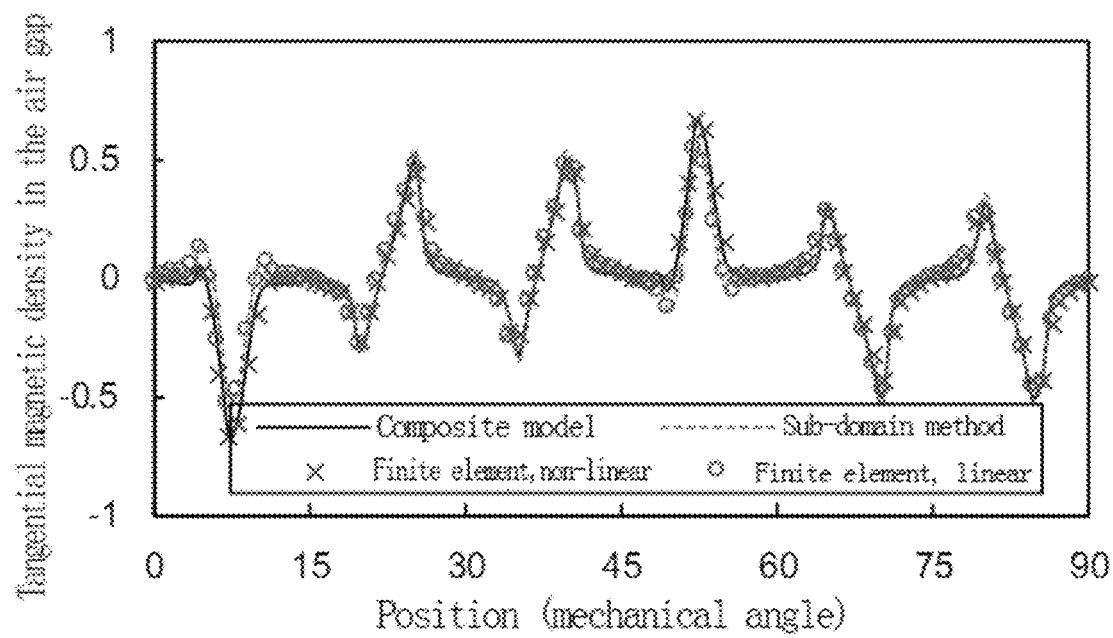
FIG. 12 is a schematic diagram for comparing the predicted tangential magnetic flux density in the air gap under load conditions between the present invention and other three methods.
Figure 13:
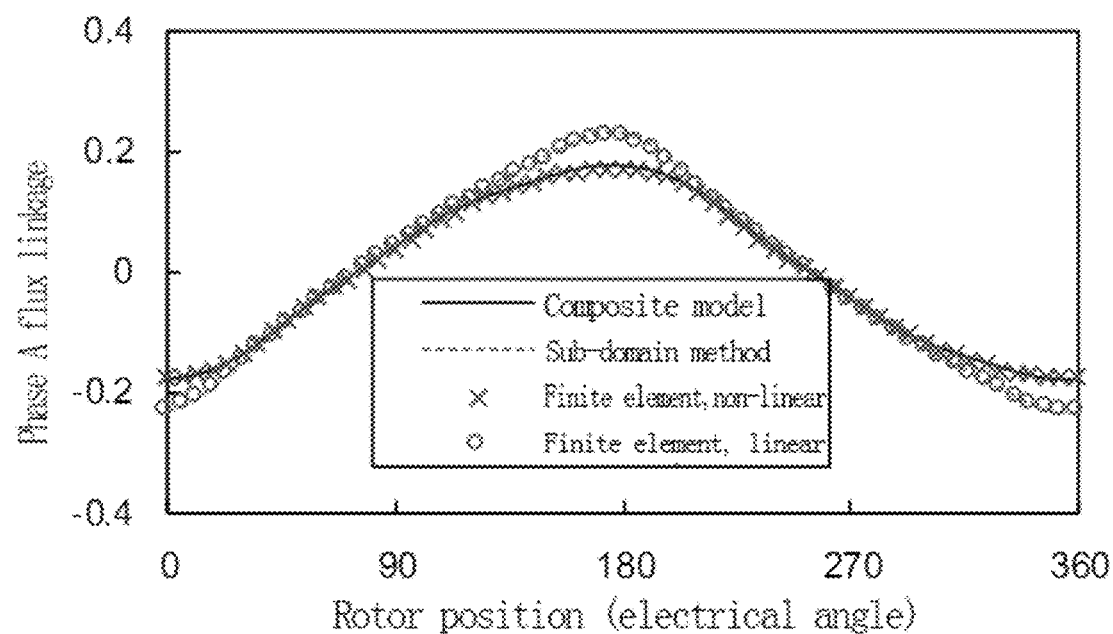
FIG. 13 is a schematic diagram for comparing the predicted A-phase flux linkage under load conditions between the present invention and other three methods.
Figure 14:
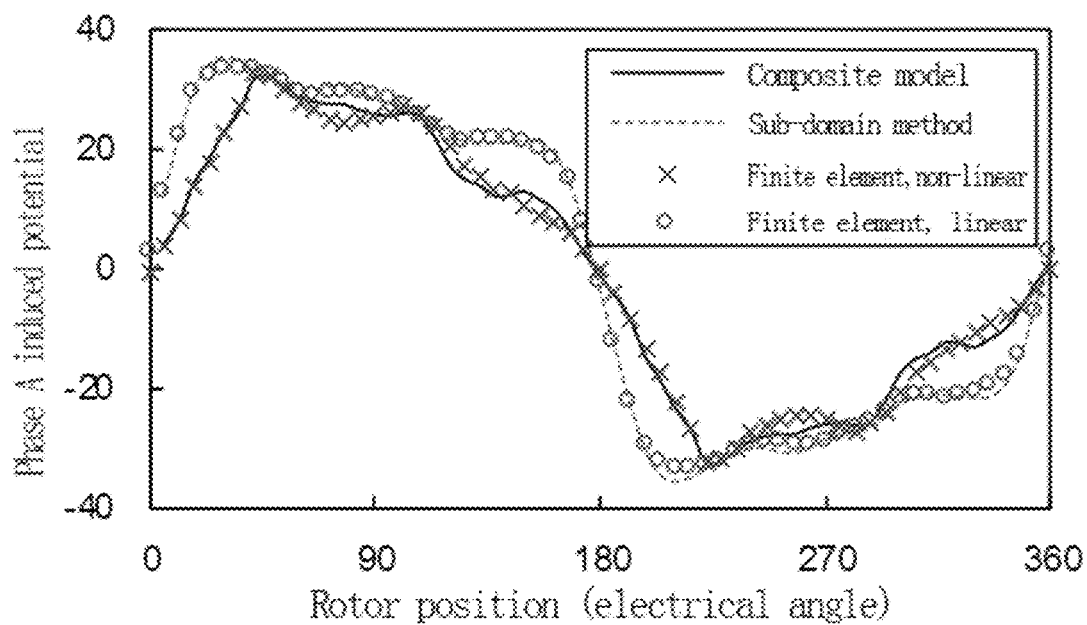
FIG. 14 is a schematic diagram for comparing the predicted A-phase induced electromotive force under load conditions between the present invention and other three methods.
Figure 15:
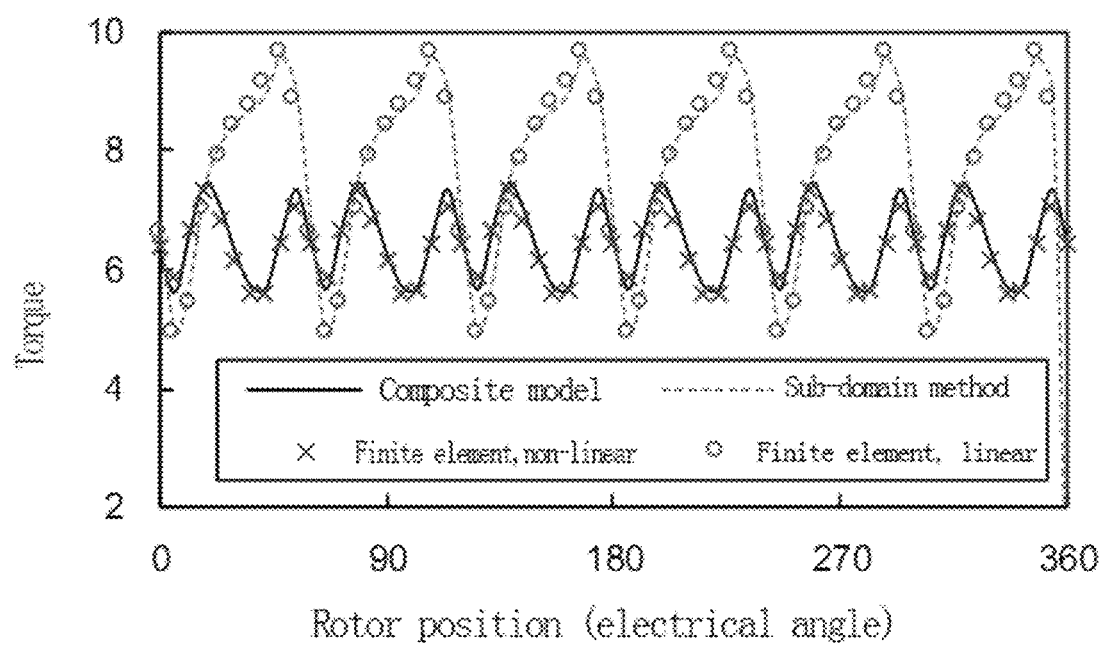
FIG. 15 is a schematic diagram of the predicted total torque and the prototype experimental results under load conditions between the present invention and other three methods.

The analysis results of the load magnetic field obtained by four methods are shown in FIG. 11-FIG. 15. FIG. 11 and FIG. 12 are the radial magnetic flux density and tangential magnetic flux density in the air gap predicted by the four methods. FIG. 13, FIG. 14 and FIG. 15 are phase A flux linkages, phase A induced electromotive force and total torque predicted by four methods.

From the figures, the prediction results of the present invention are highly consistent with the finite element nonlinear algorithm, and the sub-domain method is highly consistent with the finite element linear algorithm. However, in actual machine design, the nonlinearity of the prototype is a characteristic that must be considered. Therefore, the non-linear algorithm proposed by the present invention has higher calculation accuracy than that of the sub-domain method and the finite element linear algorithm. Compared with the finite element non-linear algorithm, the non-linear algorithm proposed by the present invention can provide suggestions for optimization because the machine performance corresponds to the size of the machine.

The above process includes 61 field calculation points in one electrical cycle. The four methods use the same computer, with CPU of i7-7700. The finite element method is based on the An sys Maxwell platform, and the present invention and the sub-domain method are based on MAT-LAB. The number of meshes in the finite element model is 23,750. Table 2 shows the calculation time of the four methods for the machine under no-load and load conditions. It can be observed from the table, the model proposed by the present invention can greatly save the solving time compared to the conventional finite element model.

TABLE 2

| Calculation time(s) | The invention | Finite element nonlinear algorithm | Conventional sub-domain method | Finite element linear algorithm |
|---|---|---|---|---|
| No-load | 13 | 230 | 0.64 | 197 |
| Load | 16.92 | 287 | 0.78 | 216 |

Therefore, the electromagnetic analysis of the prototypes proposed in Table 1 through these four methods has proven that the non-linear algorithm proposed by the present invention can accurately calculate the electromagnetic performance of the machine, greatly shortening the design cycle of the machine, which can provide suggestions for optimization and is very suitable for the machine design process.

When the object of this embodiment is a two-dimensional magnetic circuit, an analytical model of two-dimensional magnetic circuit is used; when the object of this embodiment is a three-dimensional magnetic circuit, an analytical model of three-dimensional magnetic circuit can be used, as long as the boundary condition of the corresponding analytical model are set to the boundary condition of this embodiment.

Figure 17:
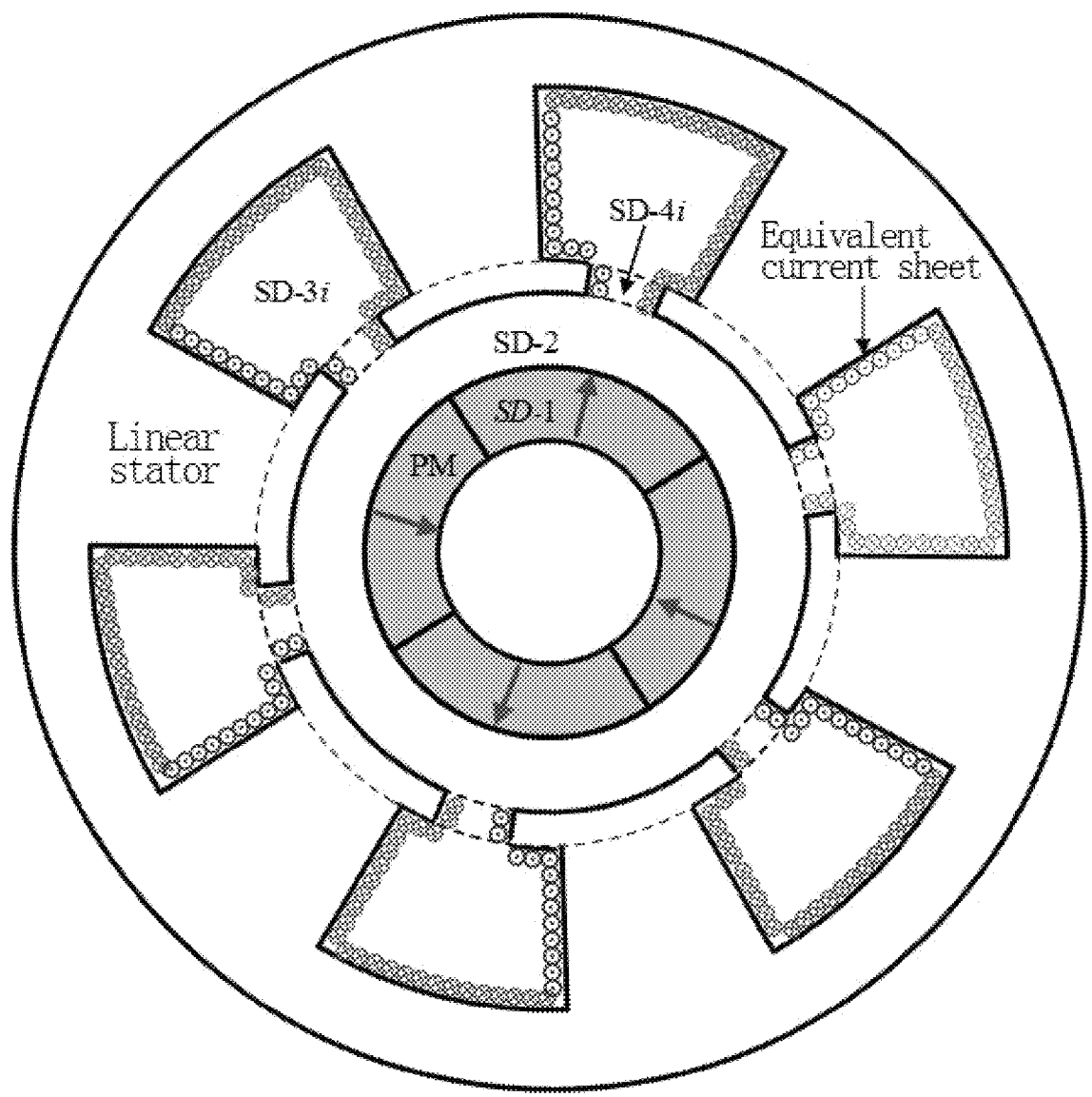
FIG. 17 is a nonlinear composite model suitable for use when a surface-mounted permanent magnet machine has tooth tips.

Example 2: Analytical Model of Surface-Mounted Permanent Magnet Machine with Tooth Tips FIG. 17 shows an applicable non-linear composite model when the surface-mounted permanent magnet machine has tooth tips. SD-1 is a permanent magnet sub-domain, SD-2 is an air gap sub-domain, SD-3 is a slot sub-domain, and SD-4 is a slot opening sub-domain. Among them, an equivalent current sheet is added to the slot opening part to simulate the non-linear effect of the tooth tip part. The difference between this embodiment and Example 1 is that: two slot sides of the slot opening sub-domain SD-4 add the current density of the equivalent current sheet as a boundary condition of slot opening sub-domain SD-4 when boundary conditions are set for the sub-domain method. Other calculation processes, for example, the iteration way of the magnetic circuit method, the sub-domain method and the magnetic circuit method is the same as that of Example 1, and is not described again.

When the object of this embodiment is a two-dimensional magnetic circuit, an analytical model of two-dimensional magnetic circuit is used; when the object of this embodiment is a three-dimensional magnetic circuit, an analytical model of three-dimensional magnetic circuit can be used, as long as the boundary condition of the corresponding analytical model are set to the boundary condition of this embodiment.

Figure 18:
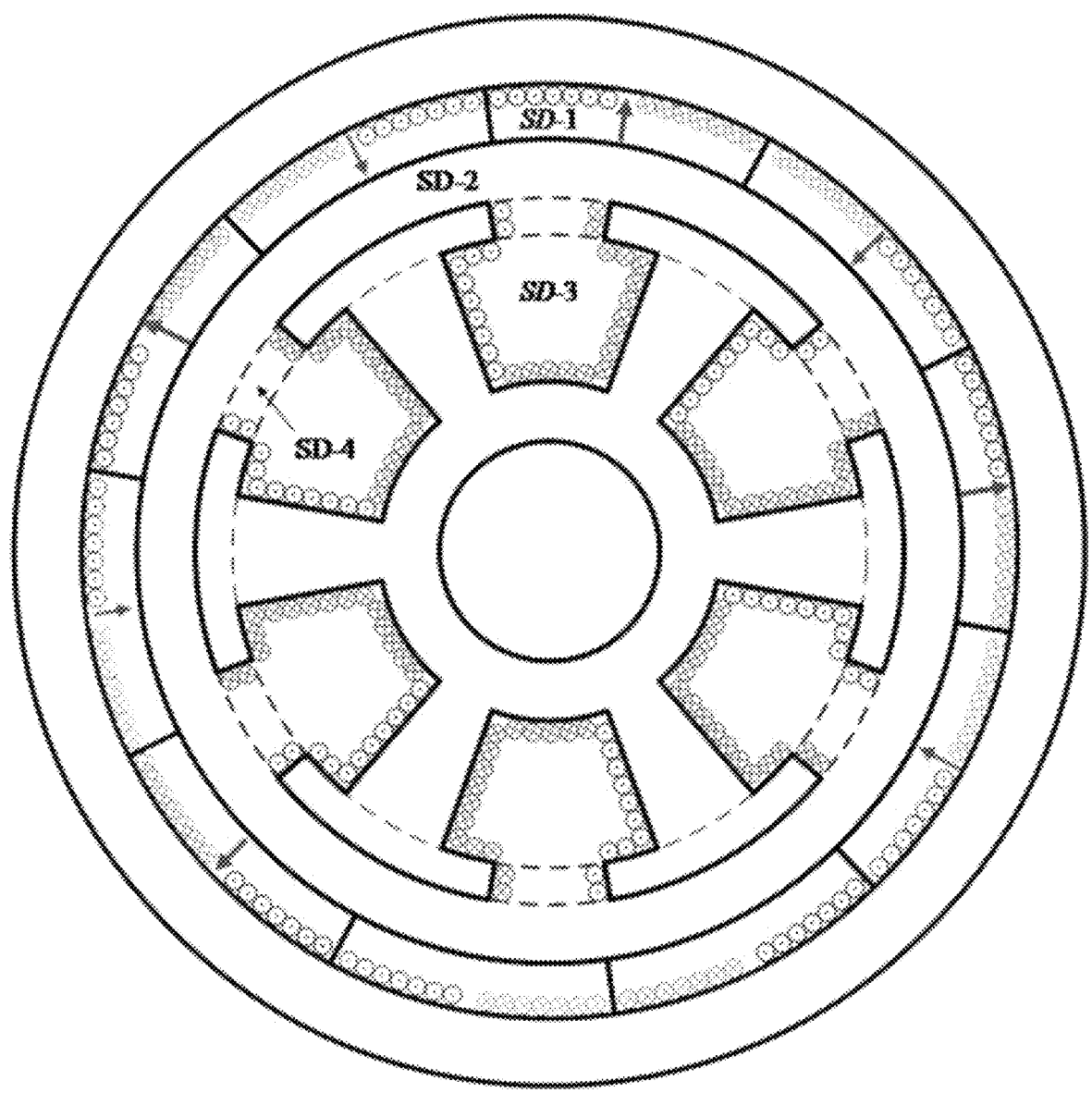
FIG. 18 is a composite model of an outer rotor surface-mounted permanent magnet machine suitable for consideration of the rotor nonlinear effects.

Example 3: External Rotor Surface-Mounted Permanent Magnet Machine Considering Rotor Non-Linear Effects FIG. 18 shows an applicable composite model of an external rotor surface-mounted permanent magnet machine considering the nonlinear effects of the rotor. The difference between this embodiment and Example 2 is that: an equivalent current sheet is added between the permanent magnet and the rotor yoke to simulate the nonlinear effect of the rotor yoke. That is, the boundary conditions of sub-domain method comprise a current density of equivalent current sheets at the interface between the rotor permanent magnet SD-1 and the rotor yoke as a boundary condition, the boundary condition of stator slot sub-domain SD-3 and the boundary condition of slot opening sub-domain SD-2. Other calculation processes, for example, the iteration way of the magnetic circuit method, the sub-domain method and the magnetic circuit method is the same as that of Examples 1 and 2, and is not described again.

When the object of this embodiment is a two-dimensional magnetic circuit, an analytical model of two-dimensional magnetic circuit is used; when the object of this embodiment is a three-dimensional magnetic circuit, an analytical model of three-dimensional magnetic circuit can be used, as long as the boundary condition of the corresponding analytical model are set to the boundary condition of this embodiment.

It should be noted that, if the stator slot of this permanent magnet machine is an open slot (i.e., without slot opening SD-2), an equivalent current sheet is added between the permanent magnet and the rotor yoke to simulate the non-linear effect of the rotor yoke. That is, the boundary conditions of sub-domain method comprise a current density of equivalent current sheets at the interface between the rotor permanent magnet SD-1 and the rotor yoke, the equivalent current density of two slot sides of stator slot sub-domain SD-3 and the equivalent current density of slot bottom. Other calculation processes, for example, the iteration way of the magnetic circuit method, the sub-domain method and the magnetic circuit method is the same as that of Example 1 and is not described again.

Figure 19:
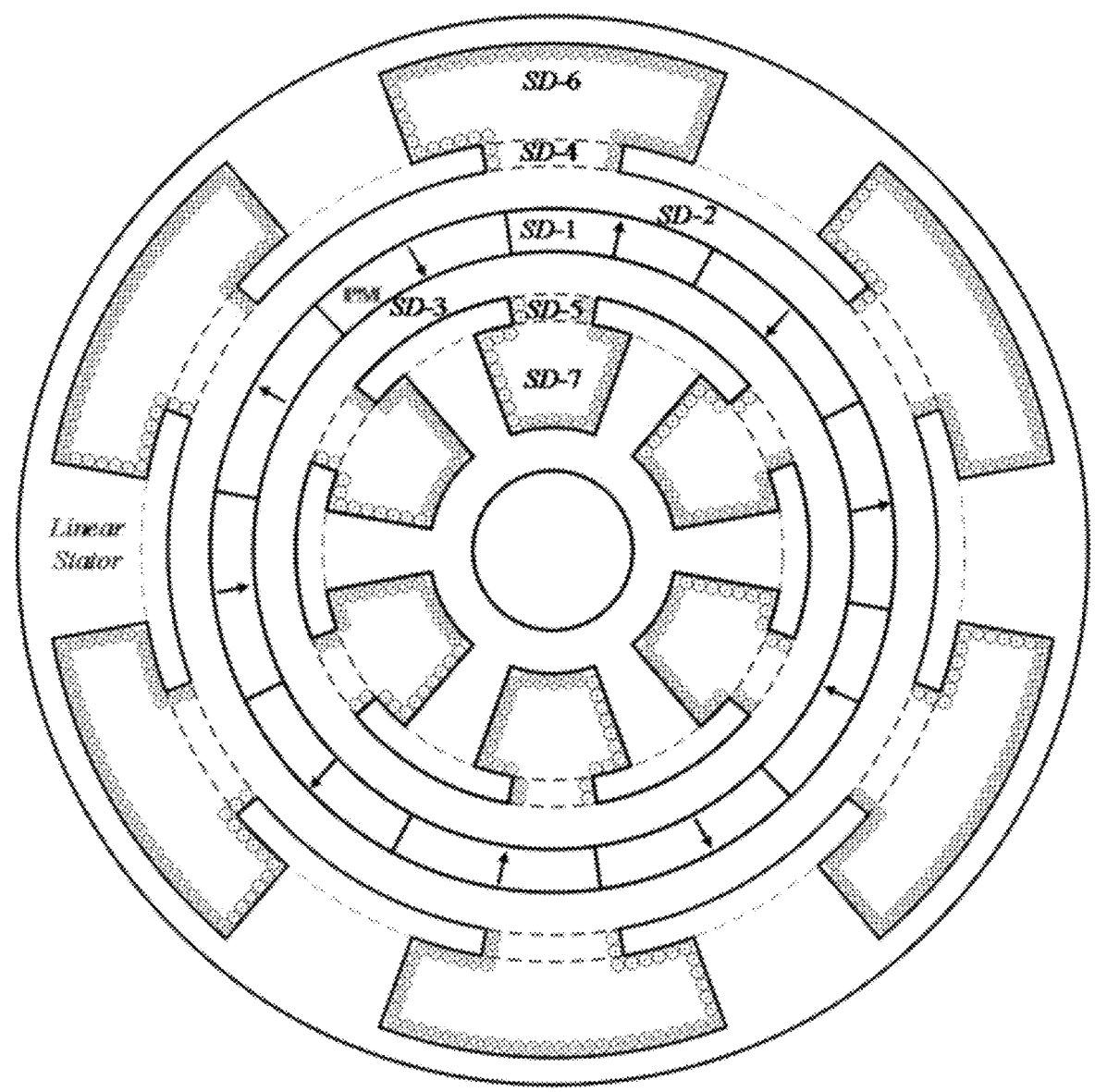
FIG. 19 is a nonlinear composite model suitable for a dual-stator surface-mounted permanent magnet machine.

Example 4: Electromagnetic Analytical Model of a Dual-Stator Surface-Mounted Permanent Magnet Machine FIG. 19 shows an applicable nonlinear composite model of a dual-stator surface-mounted permanent magnet machine. The difference between this embodiment and Example 1 is that: SD-7 in internal stator slot, SD-5 in internal stator slot opening, SD-6 in external stator slot and SD-4 in external stator slot opening have been added with equivalent current sheet to simulate non-linear effects inside and outside the status core. That is, the boundary conditions of sub-domain method comprise equivalent current density of two slot sides and one slot bottom of the internal stator slot SD-7, equivalent current density of two slot sides of the internal stator slot opening SD-5, the equivalent current density of two slot sides and one slot bottom of external stator slot SD-6, and the equivalent current density of two slot sides of the external stator slot opening SD-4. Other calculation processes, for example, the iteration way of the magnetic circuit method, the sub-domain method and the magnetic circuit method is the same as that of Example 1 and is not described again.

When the object of this embodiment is a two-dimensional magnetic circuit, an analytical model of two-dimensional magnetic circuit is used; when the object of this embodiment is a three-dimensional magnetic circuit, an analytical model of three-dimensional magnetic circuit can be used, as long as the boundary condition of the corresponding analytical model are set to the boundary condition of this embodiment.

Figure 20:
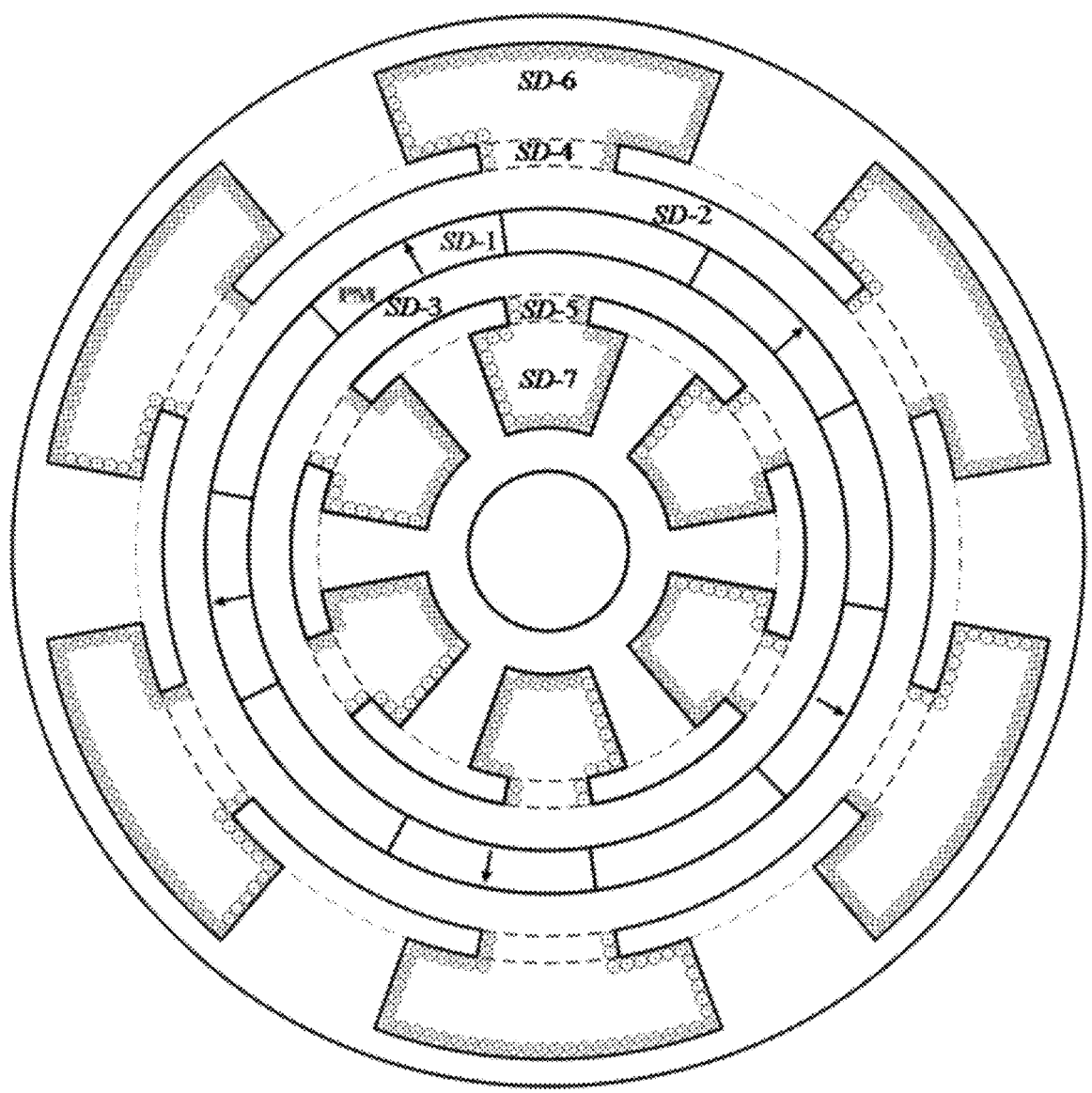
FIG. 20 is a nonlinear composite model suitable for a dual-stator consequent-pole permanent magnet machine.

Example 5: Electromagnetic Analytical Model of a Dual-Stator Consequent-Pole Permanent Magnet Machine FIG. 20 shows an applicable nonlinear composite model of a dual-stator consequent-pole permanent magnet machine. The range of consequent-pole machine permanent magnet sub-domain is $\alpha_{im}-\alpha_{mag}/2 \leq \alpha \leq \alpha_{im}+\alpha_{mag}/2$; where $\alpha_{mag}$ is the width angle of the permanent magnet, $\alpha_{im}$ is the center line of the i-th permanent magnet, the consequent-pole rotor permanent magnet sub-domain adds the boundary condition on the interface with the adjacent soft magnetic material, and the boundary condition is represented by the magnetic flux density: $B_{rmi}|_{\alpha=\alpha_{im}\pm\alpha_{mag}}=0$, $B_{rmi}$ represents the radial magnetic flux density in the permanent magnet.

That is, the difference between this embodiment and Example 1 is: the boundary conditions of sub-domain method comprise the equivalent current density of two slot sides and one slot bottom of the internal stator slot SD-7, the equivalent current density of two slot sides of the internal stator slot opening SD-5, equivalent current density of two slot sides and one slot bottom of the external stator slot SD-6, and the equivalent current density of two slot sides of the external stator slot opening SD-4, and the consequent-pole rotor permanent magnet sub-domain is added with the boundary condition on the interface with the adjacent soft magnetic material, and the boundary condition is represented by the magnetic flux density: $B_{rmi}|_{\alpha=\alpha_{im}\pm\alpha_{mag}}=0$, $B_{rmi}$ represents the radial magnetic flux density in the permanent magnet. Other calculation processes, for example, the iteration way of the magnetic circuit method, the sub-domain method and the magnetic circuit method is the same as that of Example 1 and is not described again.

When the object of this embodiment is a two-dimensional magnetic circuit, an analytical model of two-dimensional magnetic circuit is used; when the object of this embodiment is a three-dimensional magnetic circuit, an analytical model of three-dimensional magnetic circuit can be used, as long as the boundary condition of the corresponding analytical model are set to the boundary condition of this embodiment.

Figure 21:
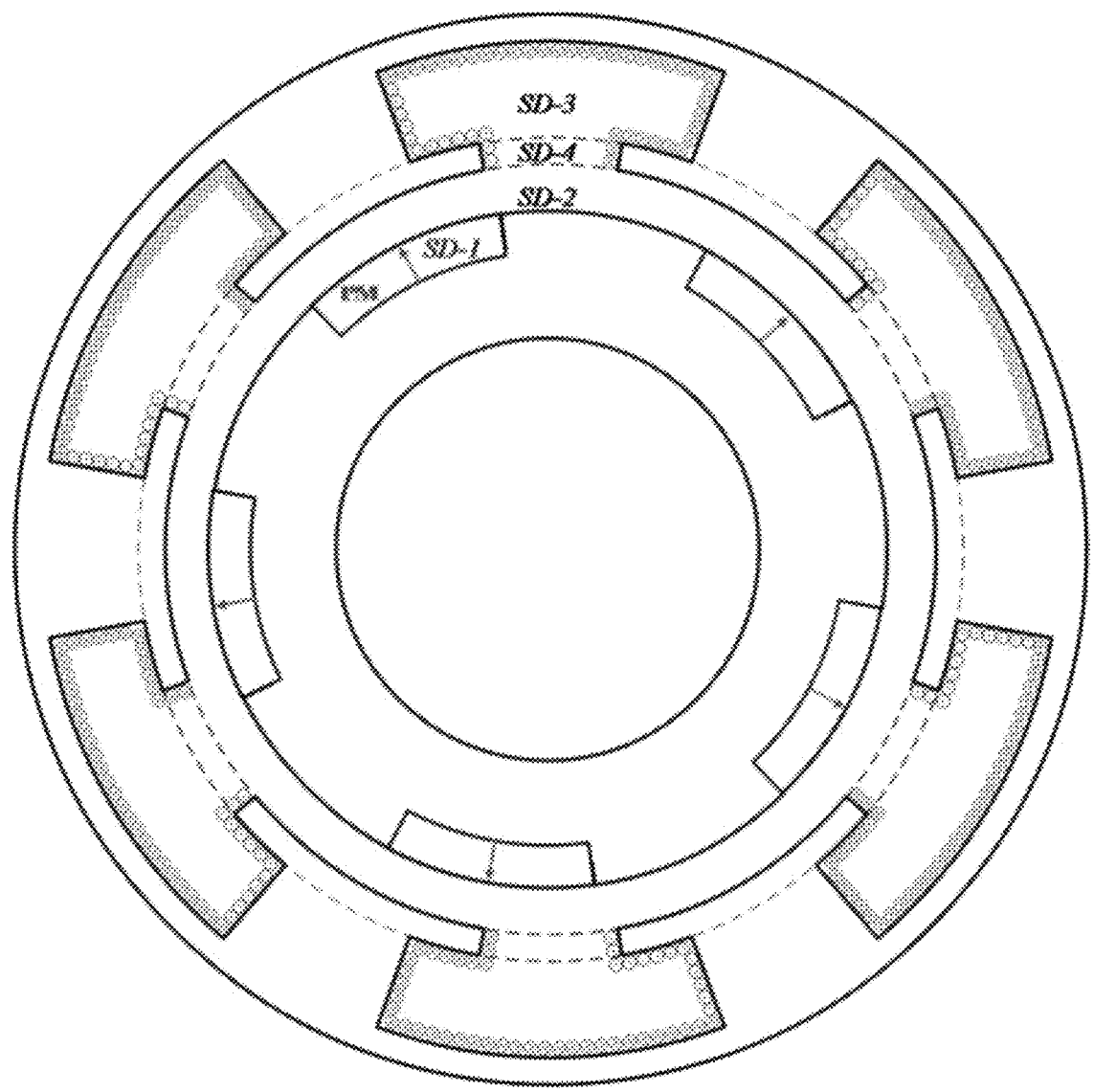
FIG. 21 is a nonlinear composite model suitable for a surface plug-in consequent-pole permanent magnet machine.

Example 6: Analytical Model of a Surface Plug-In Consequent-Pole Permanent Magnet Machine FIG. 21 shows an applicable nonlinear composite model of a surface plug-in consequent-pole permanent magnet machine. The difference between this embodiment and Example 5 is that this embodiment is an internal rotor electron and has only one stator.

The boundary conditions of the sub-domain method of this embodiment comprise the equivalent current density of two slot sides and one slot bottom of the internal stator slot SD-3, the equivalent current density of two slot sides of the stator slot opening SD-4, and the consequent-pole rotor permanent magnet sub-domain is added with a boundary condition on the interface with the adjacent soft magnetic material, and the boundary condition is represented by the magnetic flux density: $B_{rmi}|_{\alpha=\alpha_{im}\pm\alpha_{mag}}=0$, $B_{rmi}$ represents the radial magnetic flux density in the permanent magnet. Other calculation processes, for example, the iteration way of the magnetic circuit method, the sub-domain method and the magnetic circuit method is the same as that of Examples 1 and 5 and is not described again.

When the object of this embodiment is a two-dimensional magnetic circuit, an analytical model of two-dimensional magnetic circuit is used; when the object of this embodiment is a three-dimensional magnetic circuit, an analytical model of three-dimensional magnetic circuit can be used, as long as the boundary condition of the corresponding analytical model are set to the boundary condition of this embodiment.

Figure 22:
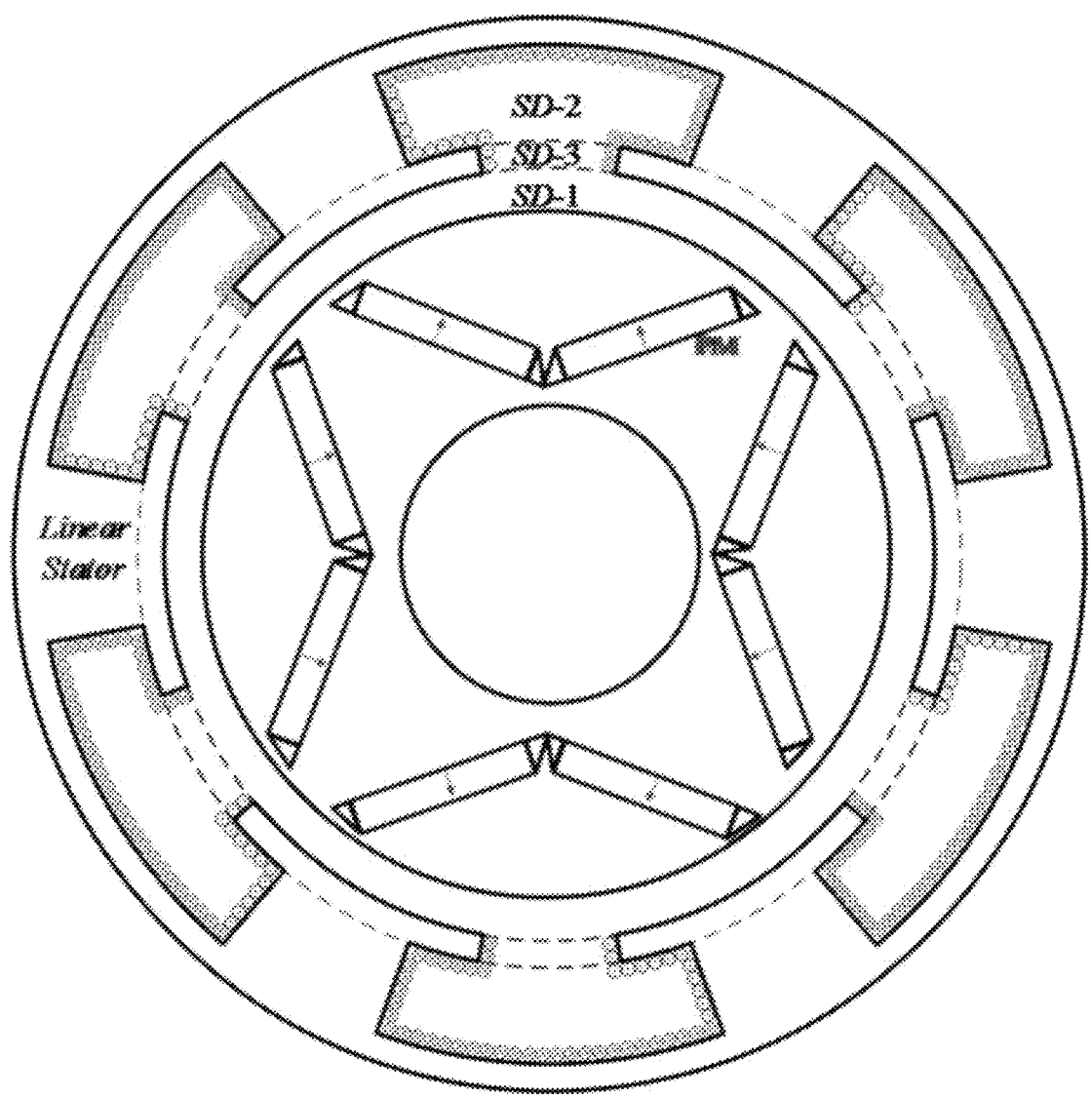
FIG. 22 is a nonlinear composite model suitable for a V-shaped built-in internal rotor permanent magnet machine.

Example 7: Analytical Model of a V-Shaped Built-In Internal Rotor Permanent Magnet Machine FIG. 22 shows an applicable nonlinear composite model of a V-shaped built-in internal rotor permanent magnet machine. The permanent magnets of the rotor portion are arranged in a V-shape, and are provided with a magnetically isolated magnetic bridge. Permanent magnet and rotor yoke are solved by magnetic circuit method, while air gap and slot are solved by sub-domain method considering current density. Equivalent current sheet is added in stator slot and slot opening to simulate nonlinear effects in core. That is, the difference between this embodiment and Example 1 is that: boundary conditions of sub-domain method comprise: the equivalent current density of two slot sides and one slot bottom of the stator slot sub-domain SD-2, the equivalent current density of two slot sides of the slot opening sub-domain SD-3, and the equivalent current density on the interface between the rotor and the air gap sub-domain SD-1. Other calculation processes, for example, the iteration way of the magnetic circuit method, the sub-domain method and the magnetic circuit method is the same as that of Example 1 and is not described again.

When the object of this embodiment is a two-dimensional magnetic circuit, an analytical model of two-dimensional magnetic circuit is used; when the object of this embodiment is a three-dimensional magnetic circuit, an analytical model of three-dimensional magnetic circuit can be used, as long as the boundary condition of the corresponding analytical model are set to the boundary condition of this embodiment.

Figure 23:
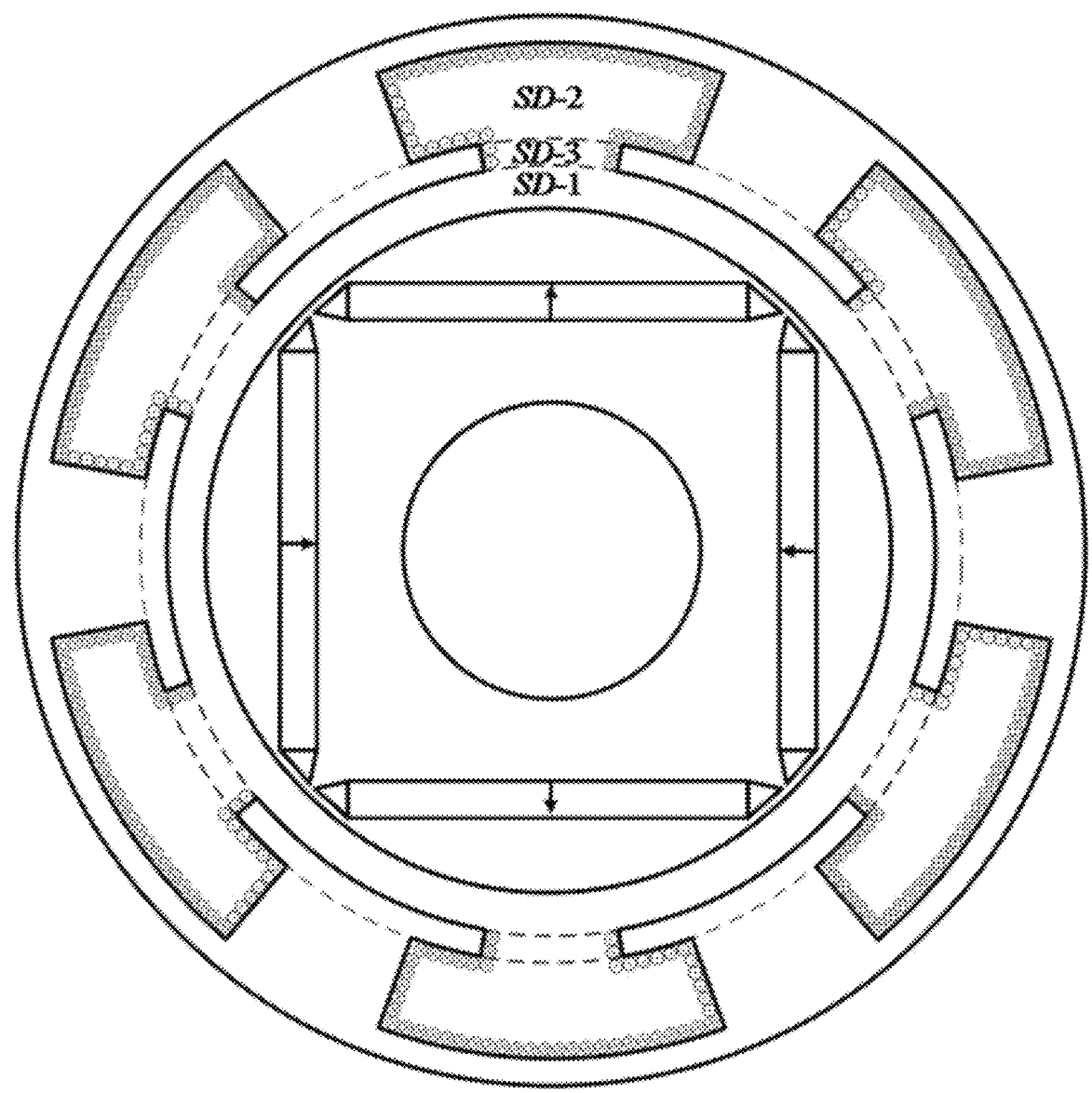
FIG. 23 is a nonlinear composite model suitable for an I-shaped built-in internal rotor permanent magnet machine.

Example 8: Electromagnetic Analytical Model of I-Type Built-In Internal Rotor Permanent Magnet Machine FIG. 23 shows an applicable nonlinear composite model of an I-shaped built-in internal rotor permanent magnet machine. The permanent magnets of the rotor portion are arranged in a I-shape, and are provided with a magnetically isolated magnetic bridge. Permanent magnet and rotor yoke are solved by magnetic circuit method, while air gap and slot are solved by sub-domain method considering current density. Equivalent current sheet is added in stator slot and slot opening to simulate nonlinear effects in core.

That is, the difference between this embodiment and Example 1 is that: boundary conditions of sub-domain method comprise: the equivalent current density of two slot sides and one slot bottom of the stator slot sub-domain SD-2, the equivalent current density of two slot sides of the slot opening sub-domain SD-3, and the equivalent current density on the interface between the rotor and the air gap sub-domain SD-1. Other calculation processes, for example, the iteration way of the magnetic circuit method, the sub-domain method and the magnetic circuit method is the same as that of Example 1 and is not described again.

When the object of this embodiment is a two-dimensional magnetic circuit, an analytical model of two-dimensional magnetic circuit is used; when the object of this embodiment is a three-dimensional magnetic circuit, an analytical model of three-dimensional magnetic circuit can be used, as long as the boundary condition of the corresponding analytical model are set to the boundary condition of this embodiment.

Figure 24:
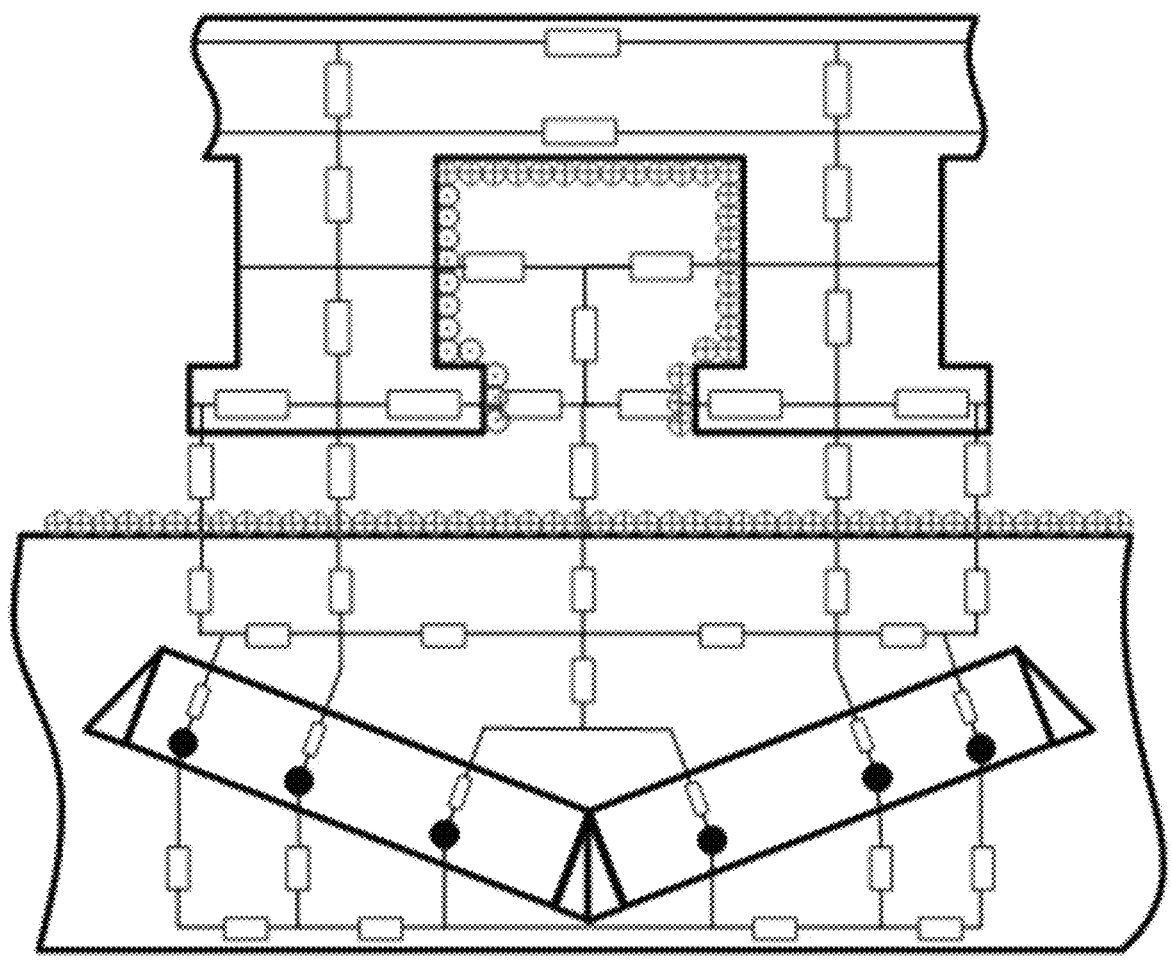
FIG. 24 is a magnetic circuit model used in FIG. 22 and FIG. 23.

FIG. 24 is one of the magnetic circuit models used in FIG. 22 and FIG. 23. Now, the idea of solving the nonlinear composite model of the built-in permanent magnet machine is described as follows: 1. Establish the entire machine magnetic network model and use the magnetic circuit method to solve the node magnetic pressure matrix. 2. According to the node magnetic pressure matrix, the magnetic potential difference between the nodes on the circumferential surface of the rotor can be calculated. Furthermore, the current density of the equivalent current sheet between each node on the circumferential surface can be obtained as the boundary condition of air gap sub-domain. At the same time, the current density of the equivalent current sheet at the edge of the stator core is calculated. The calculation method of the current density is the same as the foregoing method of the present invention, and the current density is used as the boundary condition. 3. According to the stator and rotor boundary conditions, the sub-domain method is used to solve the magnetic field distribution of air gaps, slots, and slot openings (excluding permanent magnets). 4. The iterative process is performed. On the one hand, the magnetic flux entering the rotor surface calculated by the sub-domain method is used as the magnetic flux source of the rotor magnetic circuit to calculate the rotor magnetic circuit, to obtain a new equivalent current density of the rotor circumferential surface. On the other hand, the magnetic flux entering the stator calculated by the sub-domain method is used as the magnetic flux source of the stator magnetic circuit, to solve the stator magnetic circuit and obtain a new equivalent current density on the stator surface. The equivalent current density on the rotor and stator is used as the boundary condition for the new round of sub-domain method calculations, until the current density error before and after the two iterations does not exceed the threshold, it is determined to be convergent, which is the final magnetic field distribution.

Figure 25:
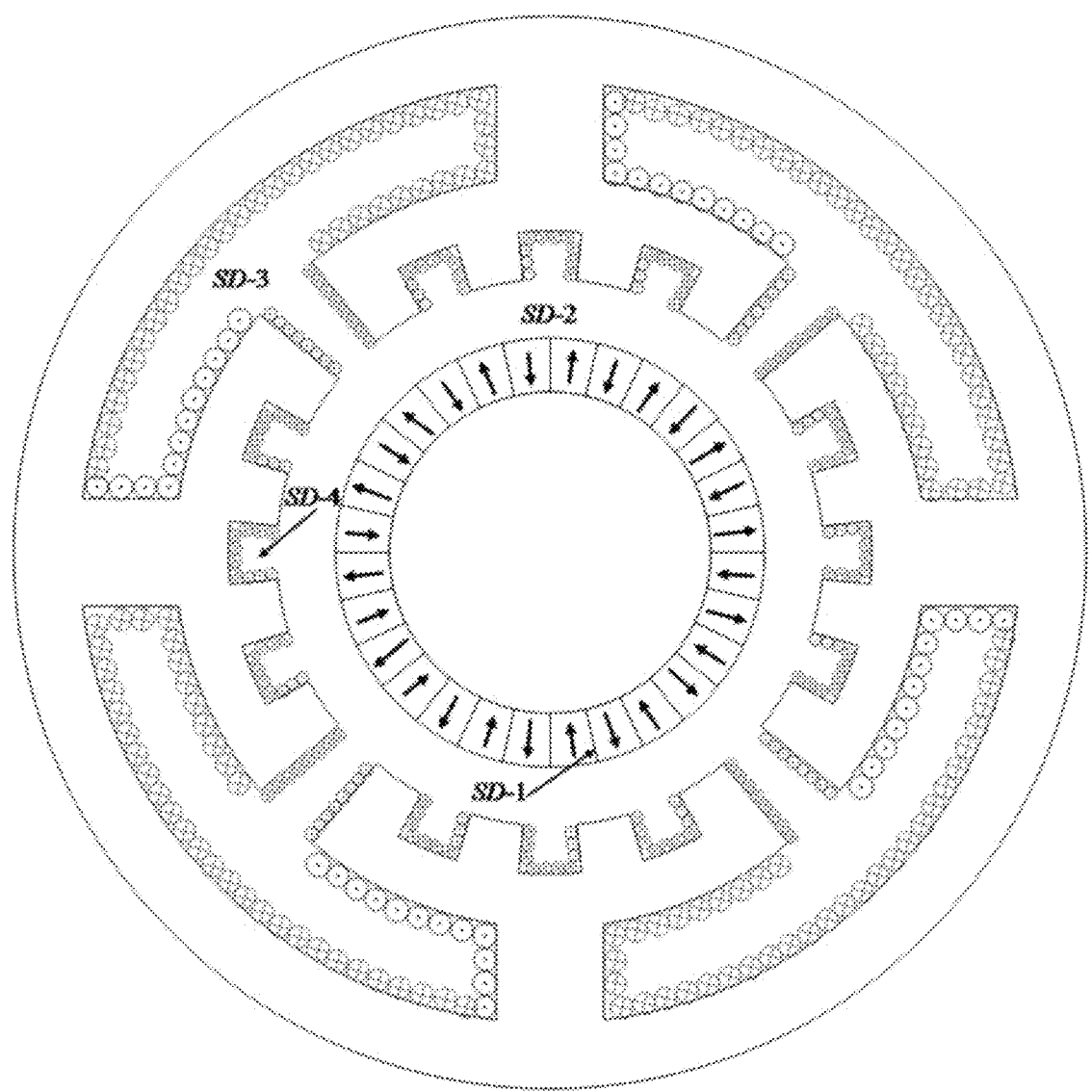
FIG. 25 is a nonlinear composite model suitable for a split-tooth permanent magnet vernier machine.

Example 9: Electromagnetic Analytical Model of a Split-Tooth Permanent Magnet Vernier Machine FIG. 25 shows an applicable nonlinear composite model of a split-tooth permanent magnet vernier machine. Among them, an equivalent current sheet is added to the stator slot and the split tooth to be equivalent to the nonlinear effect in the stator core.

That is, the difference between this embodiment and Example 1 is that: boundary conditions of sub-domain method comprise: the equivalent current density of two slot sides and one slot bottom of the stator slot sub-domain SD-3, and the equivalent current density of two slot sides of the slot opening; and the equivalent current density of all slot sides and slot bottoms in the split tooth SD-4. Other calculation processes, for example, the iteration way of the magnetic circuit method, the sub-domain method and the magnetic circuit method is the same as that of Example 1 and is not described again.

When the object of this embodiment is a two-dimensional magnetic circuit, an analytical model of two-dimensional magnetic circuit is used; when the object of this embodiment is a three-dimensional magnetic circuit, an analytical model of three-dimensional magnetic circuit can be used, as long as the boundary condition of the corresponding analytical model are set to the boundary condition of this embodiment.

Figure 16:
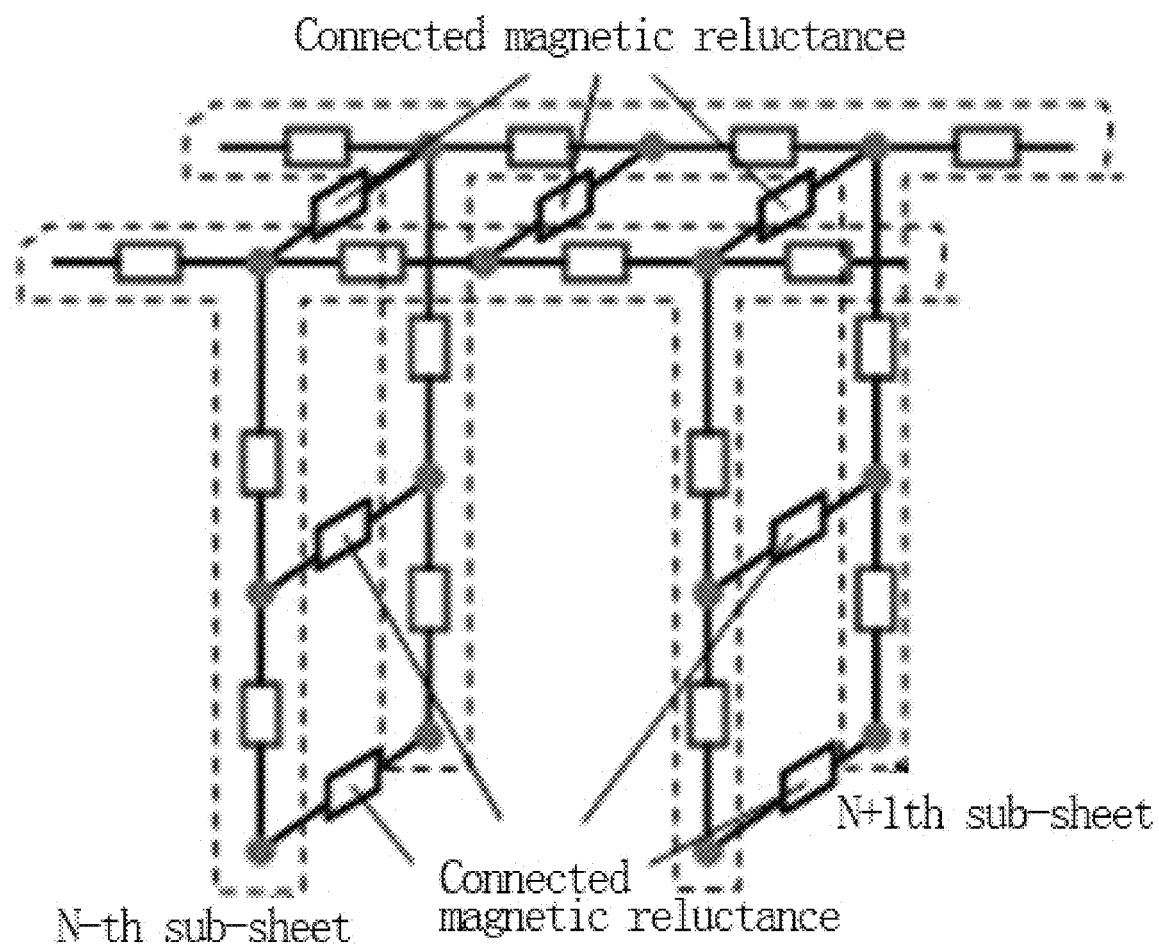
FIG. 16 is a schematic diagram of a three-dimensional magnetic circuit in which sub-sheets are axially connected by taking two sub-sheets as an example.

Example 10: A Method for Evaluating Electromagnetic Performance of a Machine Based on Three-Dimensional Magnetic Circuit A method for evaluating electromagnetic performance of a PM machine based on three-dimensional magnetic circuit, comprising: establishing an analytical model by a three-dimensional magnetic circuit, the three-dimensional magnetic circuit including a plurality of sub-sheets divided by the non-ferromagnetic material in the axial direction, as shown in FIG. 16, the solution domain of each sub-sheet being at least divided into a permanent magnet sub-domain, an air gap sub-domain, and a stator slot sub-domain, and calculating the current magnetic field distributions of the air gap sub-domain, stator slot sub-domain and/or permanent magnet sub-domain based on a sub-domain method by the analytical model through a Poisson equation or a Laplace equation; adding an equivalent current sheet to the boundary of the target sub-domain and interface between the target sub-domain and an adjacent sub-domain respectively, representing the boundary condition and interface condition by the current density of the equivalent current sheet, and solving the magnetic field distribution by a sub-domain method; the magnetic field node of all the sub-sheet being arranged in the same position, the magnetic field node at the same position of the adjacent sub-sheet being connected, the magnetic path connecting direction of the adjacent sub-sheets being axially connected, the magnetic reluctance distribution of all the sub-sheets and the connecting magnetic reluctance between adjacent sub-sheets forming a three-dimensional magnetic circuit of the machine, and solving the magnetic potential difference convergent solution of the three-dimensional magnetic circuit method according to the magnetic circuit method, and converting magnetic potential difference convergent solution to a current density of the equivalent current sheet; iterating the magnetic field distribution obtained by the sub-domain method and the current density obtained by the magnetic circuit method until a convergent current density is obtained, solving the magnetic field distribution of the target sub-domain with the convergent current density; calculating the electromagnetic performance parameters based on the magnetic field distribution and evaluating the electromagnetic performance of the machine based on the electromagnetic performance parameters.

The solving of the sub-domain method is the same as the above two-dimensional magnetic field analytical model. A three-dimensional magnetic field is constructed by the magnetic circuit method. The solving of three-dimensional magnetic field includes the magnetic reluctance in each sub-sheet and the connected magnetic reluctance between adjacent sub-sheets, and the other solving is the same as that of the two-dimensional magnetic field analytical model. Because of different temperature distribution at the axial direction, the degree of nonlinearity is different, and the magnetic field distribution of each sub-sheet is different; therefore, the uneven distribution of the magnetic field in the axial direction can be calculated by the sub-sheets elaborately, and for complex and diverse machine structures, the oblique pole and stator core discontinuity can be calculated.

The axial sub-sheet methods of three-dimensional magnetic circuit are mainly divided into two types:

The first type: the nonlinear state of the stator core is different caused by the difference in temperature in the axial direction, that is, the BH curve of the stator core is different, so the part with similar nonlinearity (that is, the part that the same BH curve can be used) is used as a sub-sheet.

The second type: because of axially different structures, such as rotor block, oblique pole, stator slot discontinuity, etc., the part with the same axial section is used as a sub-sheet.

Regardless of the sub-sheet method, the position of the magnetic field node in all sub-sheets is the same, each sub-sheet uses the respective BH curve to solve the magnetic reluctance of the current sheet; in the three-dimensional magnetic circuit, the stator core of each sub-sheet is equivalent to a two-dimensional magnetic circuit. The BH curve of the current sub-sheet is used to solve the magnetic reluctance in the sub-sheet. The same node position of the adjacent sub-sheets is connected by the connected magnetic reluctance, and the connected magnetic reluctance meter and the magnetic flux. The solution parameters of the entire three-dimensional magnetic circuit include the magnetic potential difference between the nodes in each sub-sheet and the magnetic potential difference between the same node positions of two adjacent sub-sheets. The solving by the magnetic circuit method can obtain the magnetic potential difference convergent solution of the three-dimensional magnetic circuit. The solving way of magnetic circuit method is the same as that of the two-dimensional magnetic circuit method, but the parameters of three-dimensional magnetic circuit include the magnetic reluctance of all sub-sheets and the connected magnetic reluctance between adjacent sub-sheets.

For the first sub-sheet mode, each sub-sheet has its own BH curve because of the different temperatures. When solving the entire nonlinear three-dimensional magnetic circuit, the magnetic circuit in each sub-sheet needs to be iterated according to their respective BH curve in the internal iterative process of the magnetic circuit, but the whole three-dimensional magnetic circuit (including the magnetic reluctance of the above meter and axial magnetic flux) is solved when solving. For the second sub-sheet mode, because the magnetic reluctance structure of each sub-sheet is different, the two-dimensional magnetic circuit structure of each sub-sheet may be different, but even if the magnetic circuit structure is different, the arrangement of the magnetic field node is the same, and the three-dimensional magnetic circuit is connected by the magnetic field node at the same position; this sub-sheet mode is also a solution to the entire three-dimensional magnetic circuit.

The detailed description of the iterative process of the three-dimensional magnetic circuit method is as follows: The external magnetic flux source injected into the magnetic circuit is fixed. The magnetic flux source (or magnetic field distribution) is obtained by the sub-domain method. The iterative process is essentially to find the permeability of each magnetic reluctance, permeability $\mu=B/H$, B is the magnetic induction strength, H is the magnetic field strength. When the magnetic circuit method is solved, B and H of each sub-sheet are determined according to the BH curve. Different abscissas H will correspond to different permeability. At the beginning of the iteration, each magnetic reluctance is given an initial permeability, and the initial permeability is a random value. You can choose a larger value first, that is, assuming that it is not saturated at the beginning; then according to the magnetic flux source (magnetic field distribution) obtained by the sub-domain method and the initial permeability, the magnetic potential difference of each node is obtained, and then the magnetic field strength H on each magnetic reluctance is calculated. H corresponds to permeability $\mu$, and it is required to judge if the difference between the permeability $\mu$ and the permeability $\mu$(or initial permeability $\mu$) of the previous iteration is within the allowable error range. If it is, the permeability is determined to be converged; if not, the permeability is used as the current permeability to repeat the iterative calculation until the permeability converges. After convergent permeability is obtained, the convergent node magnetic potential difference is obtained from permeability, and the node magnetic potential difference is converted into equivalent current density. The equivalent current density is entered in the sub-domain method as the boundary condition to obtain the current magnetic field distribution; the current magnetic field distribution is entered into the magnetic circuit method to continue iteration to obtain a new converging magnetic potential difference; repeat this process until a convergent current density is obtained.

Figure 26:
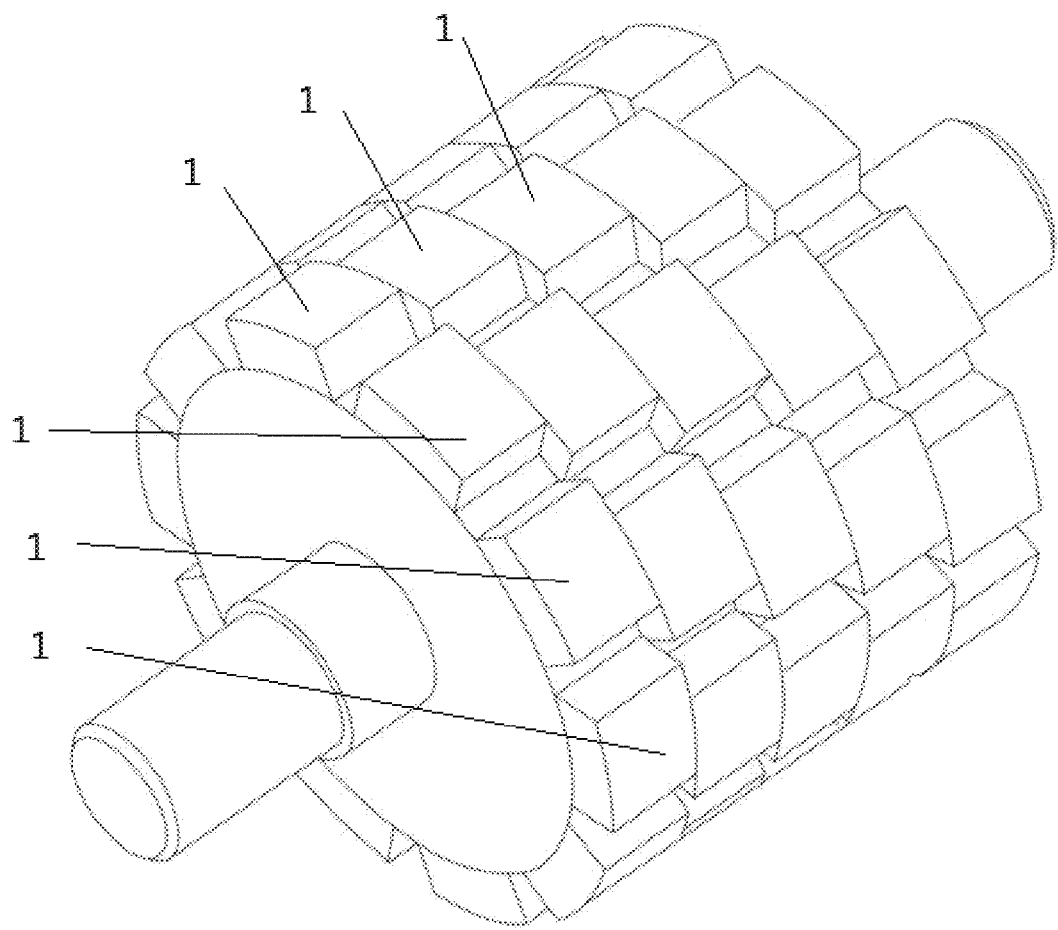
FIG. 26 is a three-dimensional rotor model of permanent magnet block and oblique pole, suitable for the three-dimensional magnetic field analytical model proposed by the present invention.

FIG. 26 is a three-dimensional rotor model of permanent magnet block and oblique pole. According to the axial length sub-sheet of the permanent magnet 1, each sub-sheet uses a sub-domain method to solve the magnetic field distribution, and the status core (not shown in the figure) is solved by the magnetic circuit method based on a three-dimensional magnetic circuit.

Figure 27:
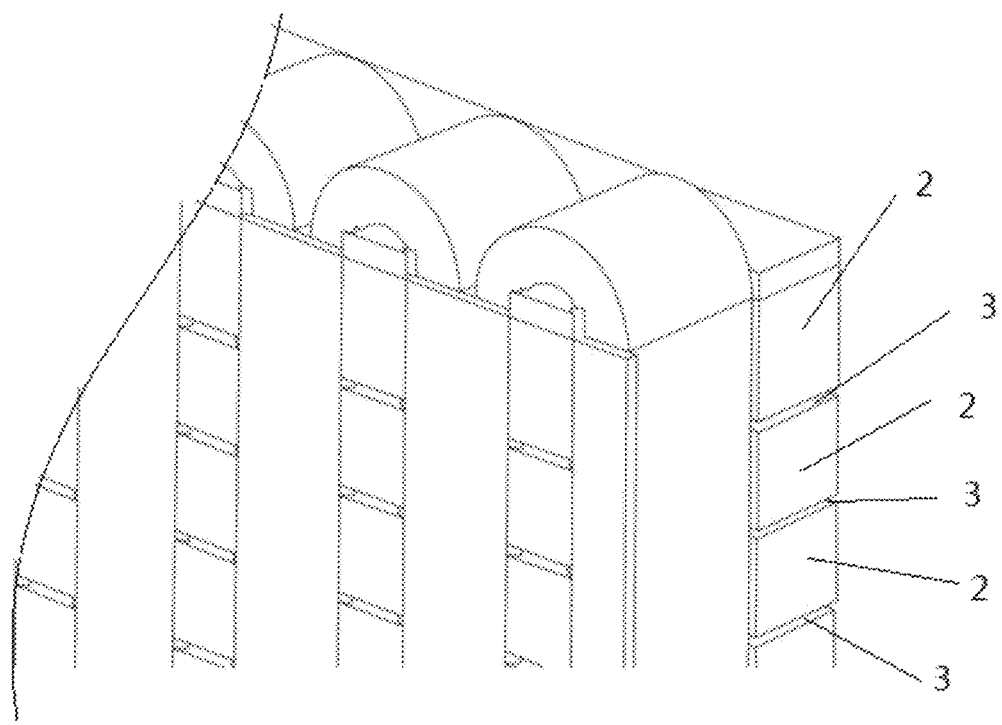
FIG. 27 is a three-dimensional stator model including an axial ventilation slot, suitable for the three-dimensional magnetic field analytical model proposed by the present invention.

FIG. 27 is a three-dimensional stator model including an axial ventilation slot 3. In the axial direction, there is a ventilation slot 3 between adjacent status cores 2. When performing axial sub-sheet, the stator core 2 and ventilation slot 3 are on different sub-sheets. The magnetic field distribution is solved by the sub-domain method for each sub-sheet, and the stator core is solved by the magnetic circuit method based on the three-dimensional magnetic circuit.

Figure 28:
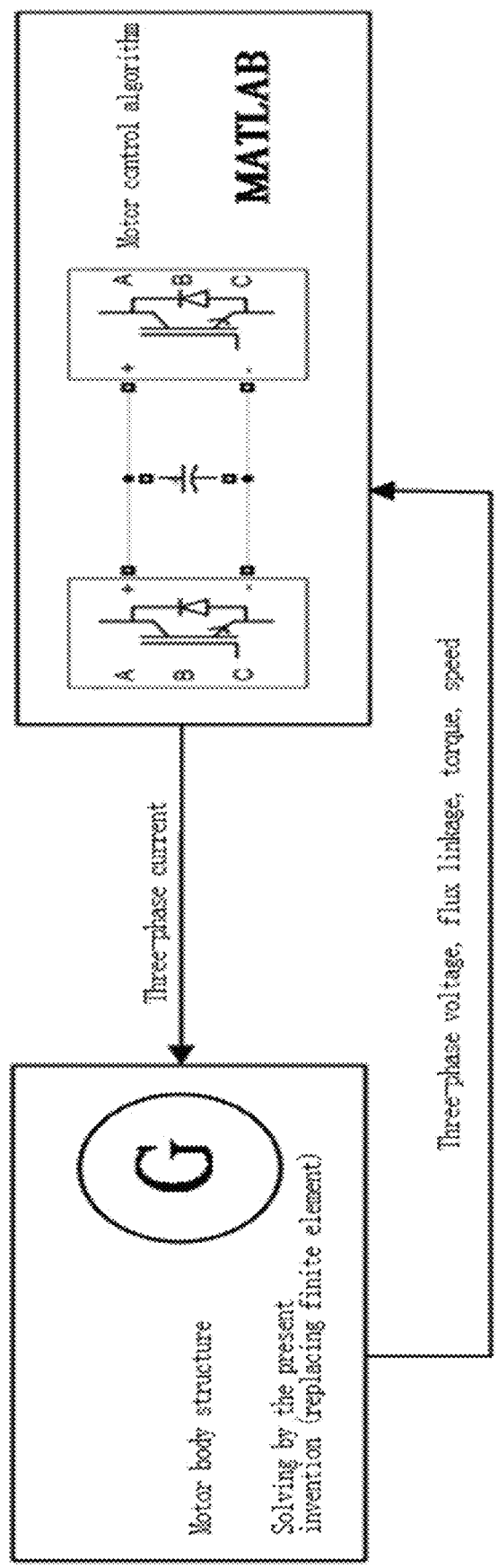
FIG. 28 is a schematic diagram of co-simulation between the magnetic field distribution solved by the present invention and the control algorithm provided by MATLAB.

FIG. 28 is a schematic diagram of co-simulation between the magnetic field distribution solved by the present invention and the control algorithm provided by MATLAB.

The foregoing embodiments describe the technical solutions and beneficial effects of the present invention in detail. It should be understood that the above embodiments are only specific embodiments of the present invention and are not intended to limit the present invention. Any modification, supplement and equivalent replacement made shall fall within the scope of protection of the present invention.

The invention claimed is:

1. A method for evaluating electromagnetic performance of a permanent-magnet electric machine, being implemented in a computer processer or in a controller of the electric machine, the method comprising:
building an electromagnetic analytical model for the electric machine, a solution domain of the analytical model being at least divided into a permanent magnet sub-domain (SD-1), an air gap sub-domain (SD-2), and a stator slot sub-domain (SD-3),
calculating current magnetic field distributions of the air gap sub-domain (SD-2), stator slot sub-domain (SD-3) and permanent magnet sub-domain (SD-1) through a Poisson equation or a Laplace equation;
adding an equivalent current sheet (A) to a boundary of a target sub-domain and to an interface between the target sub-domain and an adjacent sub-domain respectively, using a current density of the equivalent current sheet (A) to represent a boundary condition and an interface condition, and calculating a magnetic field distribution on basis of the sub-domains by a sub-domain method;
calculating a magnetic potential difference of each part of a core of the electric machine by a magnetic circuit method according to the current magnetic field distributions, and converting the magnetic potential difference to the current density of the equivalent current sheet (A);
iterating the magnetic field distribution obtained on basis of the sub-domains and the current density obtained by the magnetic circuit method until a convergent current density is obtained, solving and obtaining a magnetic field distribution of the target sub-domain by using the convergent current density;
calculating electromagnetic performance parameters on basis of the magnetic field distribution of the target sub-domain,
comparing the calculated electromagnetic performance parameters with standard electromagnetic performance parameters pre-stored in the processer or the controller, and obtaining an evaluating result of the electromagnetic performance to design the electric machine according to the evaluating result.

2. The method according to claim 1, wherein the analytical model divides the solution domain on a 2D plane when a two-dimensional magnetic circuit is used as a target magnetic field of the analytical model.

3. The method according to claim 2, wherein when the magnetic circuit method is used to calculate the magnetic potential difference of each stator tooth and stator yoke of the core of the electric machine, a node magnetic potential difference matrix equation is constructed according to Kirchhoff's law, and then a convergent solution of a node magnetic potential difference matrix is obtained using Newton-Raphson's law.

4. The method according to claim 2, wherein when iterating the magnetic field distribution obtained on basis of the sub-domains and the current density obtained by the magnetic circuit method starts, the current density of the equivalent current sheet (A) is preset to 0, and the sub-domain method is used to calculate the magnetic field distribution for a first time, to obtain a magnetic flux into a stator of the core of the electric machine; then the magnetic potential difference of each tooth portion and yoke portion of the stator is calculated by the magnetic circuit method, and a current density value of a corresponding equivalent current sheet (A) is obtained by the magnetic potential difference; then the current density value is used as the boundary condition of the sub-domain method to calculate again; the iterative process is repeated until a difference between the current density obtained in a previous iteration and the current density obtained in a current iteration subsequent to the previous iteration is within a preset threshold range.

5. The method according to claim 3, wherein a mutual iteration between the magnetic circuit method and the sub-domain method is: the current density obtained by the convergent solution of the node magnetic potential difference matrix is taken into the sub-domain method as the boundary condition, to obtain the current magnetic field distribution by the sub-domain method, then calculate a status core magnetic field distribution to judge if the current density of a current iteration and the current density of a previous iteration followed by the current iteration are converged; and in response to being not converged, the current magnetic field distribution is taken into the magnetic circuit method, to calculate the convergent solution of the node magnetic potential difference matrix again, and repeat the iterations until the current density of the current iteration and the current density of the previous iteration are converged.

6. The method according to claim 1, wherein when a rotor of the core of the electric machine is a consequent-pole rotor, a range of a consequent-pole machine permanent magnet sub domain is: $\alpha_{im}-\alpha_{mag}/2 \le \alpha \le \alpha_{im}+\alpha_{mag}/2$, where $\alpha_{mag}$ is a width angle of a permanent magnet, $\alpha_{im}$ is a center line of a i-th permanent magnet, the consequent-pole rotor permanent magnet sub-domain is added with a boundary condition on an interface with an adjacent soft magnetic material-, and the boundary condition on the interface with the adjacent soft magnetic material is represented by a magnetic flux density: $B_{rmi}|_{\alpha=\alpha_{im}\pm\alpha_{mag}}=0$, $B_{rmi}$ represents a radial magnetic flux density in the permanent magnet; or, when the rotor is a non-consequent-pole rotor, a range of a rotor permanent magnet sub-domain is 0-2π, a rotator permanent magnet sub-domain in the sub-domain method is added with a boundary condition at an interface between the permanent magnet and a rotor yoke of the rotor, and the boundary condition at the interface between the permanent magnet and the rotor yoke is represented by the current density of the equivalent current sheet (A).

7. The method according to claim 1, wherein the method is applied to the electric machine whose stator slot is an open slot, wherein stator slot sub-domain (SD-3) boundary conditions of the analytical model comprise boundary conditions of two slot sides and a boundary condition of a slot bottom, the boundary condition is represented by: $H_{3rI}|\alpha=\alpha_t+b_{sa}/2=J_{i1}$; $H_{3rI}|\alpha=\alpha_t-b_{sa}/2=-J_{i2}$; $H_{3\alpha i}|r=R_{sb}=-J_{i3}$; where, $b_{oa}$ is a slot width, $J_{i1}$, is a current density of an equivalent current sheet (A) on a first slot side of the stator slot, $J_{i2}$ is a current density of an equivalent current sheet (A) on a second slot side of the stator slot, $J_{i3}$ is an current density of an equivalent current sheet (A) at the slot bottom of the stator slot.

8. The method according to claim 1, wherein the method is applied to the electric machine whose stator slot has a slot opening, wherein for a semi-closed slot: the stator slot sub-domain (SD-3) comprises a boundary condition of two slot sides, a boundary condition of a slot bottom and a boundary condition of two sides of the slot opening, the boundary condition is represented by: $H_{3rI}|\alpha=\alpha_t+b_{sa}/2=J_{i1}$; $H_{3rI}|\alpha=\alpha_t-b_{sa}/2=-J_{i2}$; $H_{3\alpha i}|r=R_{sb}=-J_{i3}$; $H_{4rI}|\alpha=\alpha_t+b_{oa}/2=J_{i4}$; $H_{4rI}|\alpha=\alpha_t-b_{oa}/2=-J_{i5}$; where, $b_{oa}$ is a width of slot opening, $J_{i1}$, is a current density of an equivalent current sheet (A) on a first slot side of the stator slot, $J_{i2}$ is a current density of an equivalent current sheet (A) on a second slot side of the stator slot, $J_{i3}$ is a current density of an equivalent current sheet (A) at a slot bottom of the stator slot; $J_{i4}$, is a current density of an equivalent current sheet (A) on a first slot side of the stator slot opening, $J_{i5}$ is a current density of an equivalent current sheet (A) on a second slot side of the stator slot opening.

9. The method according to claim 1, wherein the method is applied to the electric machine which is a dual-stator surface-mounted permanent magnet electric machine, wherein equivalent current sheets (A) are added in an internal current slot (SD-7), an internal terminal slot opening (SD-5), an external terminal slot (SD-6), and an external terminal slot opening (SD-4), to simulate nonlinear effects in internal and external stator cores of the core of the electric machine; boundary conditions of the stator slot sub-domain (SD-3) comprise: an equivalent current density of two slot sides and one slot bottom of the internal stator slot (SD-7), an equivalent current density of two slot sides of the internal stator slot opening (SD-5), an equivalent current density of two slot sides and one slot bottom of the external stator slot (SD-6), and an equivalent current density of two slot sides of the external stator slot opening (SD-4).

10. The method according to claim 1, wherein the method is applied to the electric machine which is a dual-stator consequent-pole permanent magnet electric machine, wherein boundary conditions of sub-domain method comprise: an equivalent current density of two slot sides and one slot bottom of an internal stator slot (SD-7), an equivalent current density of two slot sides of an internal stator slot opening (SD-5), an equivalent current density of two slot sides and one slot bottom of an external stator slot (SD-6), and an equivalent current density of two slot sides of an external stator slot opening (SD-4), and a consequent-pole rotor permanent magnet sub-domain is added with a boundary condition on an interface with an adjacent soft magnetic material, and the boundary condition is represented by an magnetic flux density: $B_{rmi}|\alpha=\alpha_{im}+\alpha_{mag}+0$, $B_{rmi}$ represents a radial magnetic flux density in a permanent magnet.

11. The method according to claim 1, wherein the method is applied to the electric machine which is a surface plug-in consequent-pole permanent magnet electric machine, wherein boundary conditions of the sub-domain method comprise: an equivalent current density of two slot sides and one slot bottom of an stator slot (SD-3), an equivalent current density of two slot sides of an stator slot opening (SD-4), and a consequent-pole rotor permanent magnet sub-domain is added with a boundary condition on an interface with an adjacent soft magnetic material, and the boundary condition is represented by a magnetic flux density: $B_{rmi}|\alpha=\alpha_{im}+\alpha_{mag}+0$, $B_{rmi}$ represents a radial magnetic flux density in a permanent magnet.

12. The method according to claim 1, wherein the method is applied to the electric machine which is a V-shaped built-in internal rotor permanent magnet electric machine, wherein boundary conditions of the sub-domains comprise: an equivalent current density of two slot sides and one slot bottom of the stator slot sub-domain (SD-2), an equivalent current density of two slot sides of a slot opening sub-domain (SD-3), and an equivalent current density of an interface between a rotor of the core of the electric machine and the air gap sub-domain (SD-1).

13. The method according to claim 1, wherein the method is applied to the electric machine which is a I-shaped built-in internal rotor permanent magnet electric machine, wherein boundary conditions of the sub-domain method comprise: an equivalent current density of two slot sides and one slot bottom of the stator slot sub-domain (SD-2), an equivalent current density of two slot sides of a slot opening sub-domain (SD-3), and an equivalent current density of an interface between a rotor of the core of the electric machine and the air gap sub-domain (SD-1).

14. The method according to claim 1, wherein the method is applied to the electric machine which is a split-tooth permanent magnet vernier electric machine, wherein boundary conditions of the sub-domains comprise: an equivalent current density of two slot sides and one slot bottom of a stator slot sub-domain (SD-3), and an equivalent current density of two slot sides of a slot opening; and an equivalent current density of all slot sides and slot bottoms in split teeth (SD-4).

* * * * *